(12) United States Patent
Kondo et al.

(10) Patent No.: US 7,436,046 B2
(45) Date of Patent: Oct. 14, 2008

(54) SEMICONDUCTOR DEVICE AND MANUFACTURING METHOD OF THE SAME

(75) Inventors: Masao Kondo, Higashimurayama (JP); Nobuyuki Sugii, Tokyo (JP); Yoshinobu Kimura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 269 days.

(21) Appl. No.: 11/242,961

(22) Filed: Oct. 5, 2005

(65) Prior Publication Data

US 2006/0073664 A1 Apr. 6, 2006

(30) Foreign Application Priority Data

Oct. 5, 2004 (JP) ............... 2004-292598

(51) Int. Cl.
*H01L 31/117* (2006.01)
(52) U.S. Cl. ............ 257/616; 257/368; 257/617; 257/E29.297
(58) Field of Classification Search ............ 257/288, 257/368, 616, 617, E29.297
See application file for complete search history.

(56) References Cited

U.S. PATENT DOCUMENTS

| | | | |
|---|---|---|---|
| 6,927,414 B2 * | 8/2005 | Ouyang et al. ............... | 257/20 |
| 7,141,477 B2 * | 11/2006 | Noda ............... | 438/305 |
| 7,172,935 B2 * | 2/2007 | Lochtefeld et al. .......... | 438/216 |

FOREIGN PATENT DOCUMENTS

| | | |
|---|---|---|
| JP | 9-321307 | 12/1997 |
| JP | 10-270685 | 10/1998 |
| JP | 2000-31491 | 1/2000 |
| JP | 2002-217413 | 8/2002 |
| JP | 2003-110102 | 4/2003 |
| JP | 2004-39762 | 2/2004 |

* cited by examiner

*Primary Examiner*—Matthew E Warren
(74) *Attorney, Agent, or Firm*—Antonelli, Terry, Stout & Kraus, LLP.

(57) ABSTRACT

Provided is a technology capable of suppressing a reduction in electron mobility in a channel region formed in a strained silicon layer. A p type strained silicon layer is formed over a p type silicon-germanium layer formed over a semiconductor substrate. The p type strained layer has a thickness adjusted to be thicker than the critical film thickness at which no misfit dislocation occurs. Accordingly, misfit dislocations occur in the vicinity of the interface between the p type strained silicon layer and p type silicon-germanium layer. At a position which is below the end of a gate electrode and at which misfit dislocations occur, the impurity concentration of the n type strained silicon layer and n type silicon-germanium layer is $1 \times 10^{19}$ cm$^{-3}$ or less.

19 Claims, 27 Drawing Sheets

SEMICONDUCTOR DEVICE AND MANUFACTURING METHOD OF THE SAME

CROSS-REFERENCE TO RELATED APPLICATION

The present application claims priority from Japanese patent application No. 2004-292598 filed on Oct. 5, 2004, the content of which is hereby incorporated by reference into this application.

BACKGROUND OF THE INVENTION

The present invention relates to a semiconductor device and a manufacturing method thereof. In particular, the invention pertains to a technology effective when applied to a semiconductor device having a strained silicon layer.

There is a technology of forming a strain-relaxed silicon-germanium layer (SiGe layer) over a semiconductor substrate made of silicon and then forming a strained silicon layer by the epitaxial growth of a silicon layer over this silicon-germanium layer. This strained silicon layer has a higher electron mobility than that of an ordinary silicon layer so that by forming a channel of an MISFET (Metal Insulator Semiconductor Field Effect Transistor) in the strained silicon layer, the mobility of electrons flowing through the channel can be heightened, which leads to an improvement in the electrical properties of the MISFET (for example, as described in IEDM Technical Digest, p 23-26 (2002)).

As a technology of forming a strained silicon layer over a silicon-germanium layer, that of forming a silicon-germanium layer which has a small film thickness, is free of penetration dislocations, and has a flat surface on an atomic level is disclosed, for example, in Japanese Unexamined Patent Publication No. 2002-217413. According to this technology, misfit dislocations exist on the interface between a silicon substrate and the silicon-germanium layer.

In Japanese Unexamined Patent Publication No. 2004-39762, disclosed is a technology of increasing the moving speed of carriers at the end of a source, thereby achieving the speed-up of an MISFET. Described specifically, this technology is, in an MISFET having a strained SiGe layer formed over a buried insulator film, a gate electrode formed over this strained SiGe layer via a gate insulating film, and a source region and a drain region formed on both sides of the gate electrode, to maximize the Ge concentration of the channel region (under the center of the gate electrode), while minimizing the Ge concentration of the source region and drain region.

In Japanese Unexamined Patent Publication No. 2000-031491, disclosed is a technology of forming an SiGe strain-applied layer as thin as about 200 nm over an SOI (Silicon On Insulator) substrate, thereby preventing threading dislocations of the SiGe strain-applied layer, generation of cracks and worsening of surface property.

In Japanese Unexamined Patent Publication No. Hei 9(1997)-321307, disclosed is a technology of forming a high-quality strained silicon layer having a sufficient strain without damaging a reducing effect of a floating capacity brought by an SOI structure. Described specifically, after formation of an SiGe layer, as a strain-applied semiconductor layer, over a silicon substrate, a buried oxide layer is formed to divide this SiGe layer into upper and lower regions and the upper SiGe layer is thinned. In order to reduce the defects such as dislocations which occur during formation of the SiGe layer and buried oxide layer, heat treatment is performed, followed by the formation of a strained silicon layer over the upper SiGe layer. This technology makes it possible to form a strained silicon layer having a sufficient strain while maintaining a reducing effect of a floating capacity brought by an SOI structure, because the thin SiGe layer (upper side) and the strained silicon layer are formed over the buried oxide layer.

In Japanese Patent Laid-Open No. Hei 10(1998)-270685, disclosed is a technology of forming a strained silicon layer over a silicon-germanium layer and then forming an MISFET over the strained silicon layer. In this technology, the source region and drain region of the MISFET are formed in the strained layer so that the pn junction between the source region and drain region exists in the strained silicon layer. By this, junction leakage of the MISFET can therefore be prevented.

In Japanese Unexamined Patent Publication No. 2003-110102, disclosed is a technology of improving the power added efficiency of a power amplification MISFET to be used for mobile terminals. Described specifically, the technology disclosed in this document is to form an MISFET by forming a first SiGe layer which is a first conductivity type and has a high impurity concentration, a second SiGe layer which is a first conductivity type and has a low impurity concentration, and a strained Si layer having a low impurity concentration over a silicon substrate in the order of mention and cause a portion of the strained Si layer to serve as a channel region; and forming a source electrode so as to pass through the second SiGe layer having a low impurity concentration and electrically connect to the first SiGe layer having a high impurity concentration or the silicon substrate. A high-density crystal defect region is formed only inside the silicon substrate or the first SiGe layer and the second SiGe layer is prevented from contacting the high-density crystal defect region.

SUMMARY OF THE INVENTION

By forming a strain-relaxed silicon-germanium layer over a semiconductor substrate and then forming a silicon layer over this silicon-germanium layer to form a strained silicon layer, it is possible to improve the electron mobility compared with that of the ordinary silicon layer. Attempts to improve the performance of an MISFET by forming the channel region of the MISFET from this strained silicon layer have been made by various research institutes.

It is known that when a strained silicon layer is formed over a strain-relaxed silicon-germanium layer, there is a relationship, as illustrated in FIG. 1, between a germanium concentration in the silicon-germanium layer and a critical thickness of the strained silicon layer at which no misfit dislocation occurs. As illustrated in FIG. 1, with an increase in the concentration of geranium, the critical thickness of the strained silicon layer decreases. For example, when the concentration of germanium is 10%, the critical thickness of the strained silicon layer is about 36 nm, and when the concentration of germanium is 20%, the critical thickness of the strained silicon layer is about 20 nm. When the concentration of germanium is 30%, the critical thickness of the strained silicon layer is about 16 nm.

When the thickness of the strained silicon layer exceeds a critical thickness, misfit dislocations occur in the vicinity of the interface between the strained silicon layer and silicon-germanium layer in order to relax a stress appearing in the strained silicon layer. Misfit dislocations are, as illustrated schematically in FIG. 2, linear and most of their whole length exists in the vicinity of the interface between the strained silicon layer and the silicon-germanium layer and they thread (penetrate) the surface of the strained silicon layer at some position.

It is conventionally thought to be essential to form an MISFET or LD (Laterally Diffused) MISFET over a strained silicon layer without causing misfit dislocations by adjusting the thickness of the strained silicon layer to not greater than the critical thickness. In practice, the thickness of the strained silicon layer is designed not to exceed the critical thickness. Leak current is thought to occur owing to misfit dislocations. Accordingly, the strained silicon layer is as thin as not greater than the critical thickness.

The manufacturing steps of an MISFET include a washing step and heat treatment step. By the washing step or heat treatment step for the formation of a gate insulating film or the like, the surface of a semiconductor substrate made of silicon is usually etched approximately 10 nm to 20 nm in depth.

When the concentration of germanium is 15% or greater, the critical thickness of the strained silicon layer at which not misfit dislocations occur is about 25 nm or less. This critical thickness is not sufficient for the above-described etching amount of the semiconductor substrate.

When the strained silicon layer is etched as a result of some processing and becomes very thin, diffusion of germanium from the silicon-germanium layer formed below the strained silicon layer spreads even to the vicinity of the surface of the strained silicon layer and causes a problem such as reduction in electron mobility in the channel region of the MISFET.

In addition, small unevenness in the thickness of the strained silicon layer leads to great unevenness in the transistor electrical properties of the MISFET. In other words, the electron mobility becomes uneven in the channel region owing to small unevenness in the thickness of the strained silicon layer, leading to a difficulty in maintaining a high yield in the manufacture of the MISFET.

Moreover, the MISFET is required to have a high breakdown voltage so that a gate insulating film must be thickened. In this case, however, a reduction in the thickness of the strained silicon layer becomes so large that it is thought to be difficult to use the strained silicon layer.

In MISFET or LDMISFET, it is the common practice to form, over the surface of its source or drain region, a metal silicide film such as cobalt silicide film or titanium silicide film in self alignment in order to reduce the resistance of the source or drain region. The metal silicide film is formed by bringing a metal film into contact with a silicon layer and then heating to cause a reaction therebetween. During this reaction, a portion of the silicon layer corresponding to the thickness of the metal silicide film thus formed is consumed. If a strained silicon layer is thin, it is consumed completely during the silicide reaction. Moreover, the silicide reaction extends even to a silicon-germanium layer formed below the strained silicon layer. When the silicide reaction thus reaches the silicon-germanium layer, an abnormal reaction occurs, which leads to generation of shape anomaly on the surface of a semiconductor substrate and an increase in resistance.

To prevent such a phenomenon, the silicide reaction is performed after accumulation of an additional silicon layer over the strained silicon layer in the source and drain regions by selective epitaxial growth, thereby thickening the silicon layer in the source and drain regions. This step for causing selective epitaxial growth of the silicon layer in the source and drain regions complicates the manufacturing method and therefore increases a manufacturing cost.

When a leak current is reduced by adjusting the source and drain regions to be shallower than the interface between the strained silicon layer and silicon-germanium layer, the source and drain regions become very thin, causing problems such as an increase in parasitic resistance and deterioration in the electrical properties of the device.

Another problem also occurs when an LDMISFET is formed over a strained silicon layer. In order to heighten the efficiency of a power amplifier composed of the LDMISFET, it is usually necessary to reduce the resistance of a drain offset region and reduce the on resistance of the transistor. The film thickness of the drain offset region must therefore be adjusted to 70 nm or greater, preferably about 100 nm. When a strained silicon layer constituting the LDMISFET is adjusted to a critical film thickness or less while adjusting the drain offset region to have the above-described thickness, most of the drain offset region is inevitably formed in the silicon-germanium layer below the strained silicon layer. At this time, the electron mobility of the silicon-germanium layer is lower than that of the strained silicon layer and moreover, lower than that of the ordinary silicon layer so that the resistance of the drain offset region cannot be reduced fully. For example, the sheet resistance when the LDMISFET is formed over an ordinary silicon layer is 1.6 k$\Omega$/□, while the sheet resistance when a strained silicon layer having a thickness not greater than a critical film thickness is formed over the silicon-germanium layer and then an LDMISFET is formed over this strained silicon layer is 1.9 k$\Omega$/□. In spite of using the strained silicon layer, the sheet resistance becomes larger compared with the use of an ordinary silicon layer. This means that because the strained silicon layer is thin, most of the drain offset region is formed in the silicon-germanium layer having low electron mobility.

An object of the present invention is to provide a technology capable of suppressing a decrease in electron mobility in a channel region formed in a strained silicon layer.

Another object of the present invention is to provide a technology capable of improving a production yield of an MISFET formed over a strained silicon layer.

A further object of the present invention is to provide a technology capable of forming an MISFET requiring a high breakdown voltage over a strained silicon layer.

A still further object of the present invention is to provide a technology capable of suppressing an abnormal reaction between a metal and a silicon-germanium layer formed below a strained silicon layer when a metal silicide film is formed over the surface of source and drain regions.

A still further object of the present invention is to provide a technology capable of reducing the on resistance of an LDMISFET formed over a strained silicon layer.

The above-described and the other objects and novel features of the present invention will be apparent from the description herein and accompanying drawings.

Outline of the typical inventions, of the inventions disclosed in the present application, will next be described.

A semiconductor device according to the present invention has an MISFET equipped with (a) a silicon-germanium layer formed over a semiconductor substrate, (b) a strained silicon layer formed over the silicon-germanium layer, (c) a gate insulating film formed over the strained silicon layer, (d) a gate electrode formed over the gate insulating film, and (e) source and drain regions, wherein the strained silicon layer is thicker than a critical film thickness at which misfit dislocations occur; and the misfit dislocations exist on the interface between the strained silicon layer and the silicon-germanium layer.

A manufacturing method of a semiconductor device according to the present invention has the steps of: (a) forming a silicon-germanium layer over a first semiconductor substrate, (b) forming, over the silicon-germanium layer, a strained silicon layer having a thickness greater than a critical film thickness at which misfit dislocations occur, thereby forming misfit dislocations on the interface between the silicon-germanium layer and the strained silicon layer; (c) preparing a second semiconductor substrate having an insulating film formed thereover; (d) bonding the surface of the first semiconductor substrate over which the strained silicon layer has been formed to the surface of the second semiconductor substrate over which the insulating film has been formed; (e) removing the first semiconductor substrate and the silicon-germanium layer formed thereover, thereby forming a strained silicon layer free of misfit dislocations via the insulating film over the second semiconductor substrate; (f) forming a gate insulating film over the strained silicon layer; (g) forming a gate electrode over the gate insulating film, and (h) forming a source region and a drain region in the strained silicon layer.

Advantages of the typical inventions, of the inventions disclosed in the present application, will next be described briefly.

A decrease in electron mobility can be suppressed in a channel region formed in a strained silicon layer, because the thickness of the strained silicon layer is made thicker than a critical film thickness at which no misfit dislocation occurs.

DETAILED DESCRIPTION OF THE INVENTION

Figure 1:
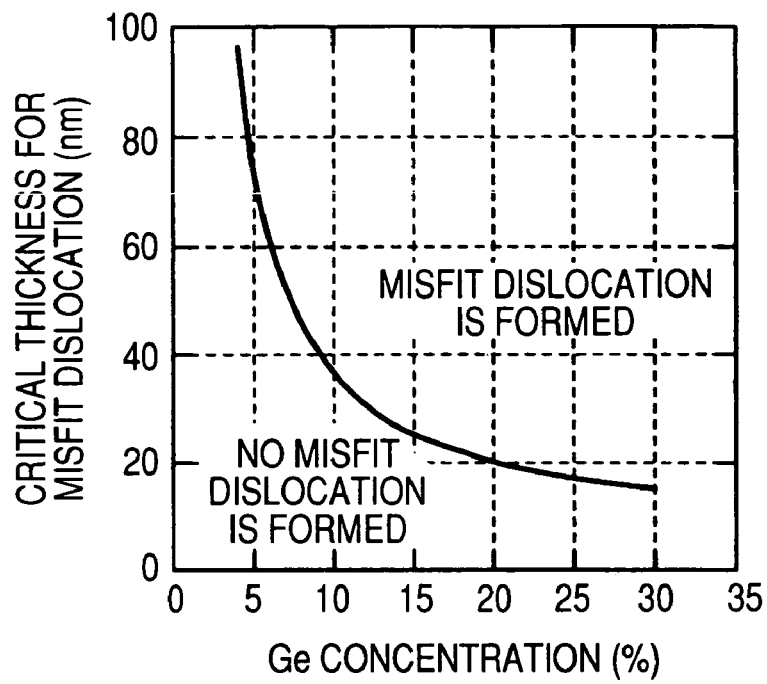
FIG. 1 illustrates the relationship between a germanium concentration and critical thickness of a strained silicon layer.

The meaning of some terms used in embodiments will hereinafter be described prior to the detailed description of the embodiments of the present invention.

1. GSM (Global System for Mobile Communication) is one of wireless communication systems or a standard used for a digital mobile telephone. There are three frequency bands defined for GSM. Of these, a 900 MHz band is called GSM900 or simply GSM; a 1800 MHz band is called GSM1800, or DCS (Digital Cellular System) or PCN; and a 1900 MHz band is called GSM 1900, DCS1900 or PCS (Personal Communication Services). GSM1900 is mainly used in North America. In addition, GSM850 which operates in the 850 MHz band is sometimes used in North America.

2. A GMSK modulation system is a system used for communication of audio signals in which the phase of a carrier wave is shifted according to transmit data. An EDGE modulation system is a system used in data communications and it is a system in which an amplitude shift may be further added to a phase shift of GMSK modulation.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount and range), the number is not limited to a specific number but can be greater than or less than the specific number unless otherwise specifically indicated or principally apparent that the number is limited to the specific number.

Moreover in the below-described embodiments, it is needless to say that the constituting elements (including element steps) are not always essential unless otherwise specifically indicated or principally apparent that they are essential.

Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range.

In all the drawings for describing the embodiments, like members of a function will be identified by like reference numerals and overlapping descriptions will be omitted.

The embodiments of the present invention will next be described in detail based on accompanying drawings.

Embodiment 1

Figure 3:
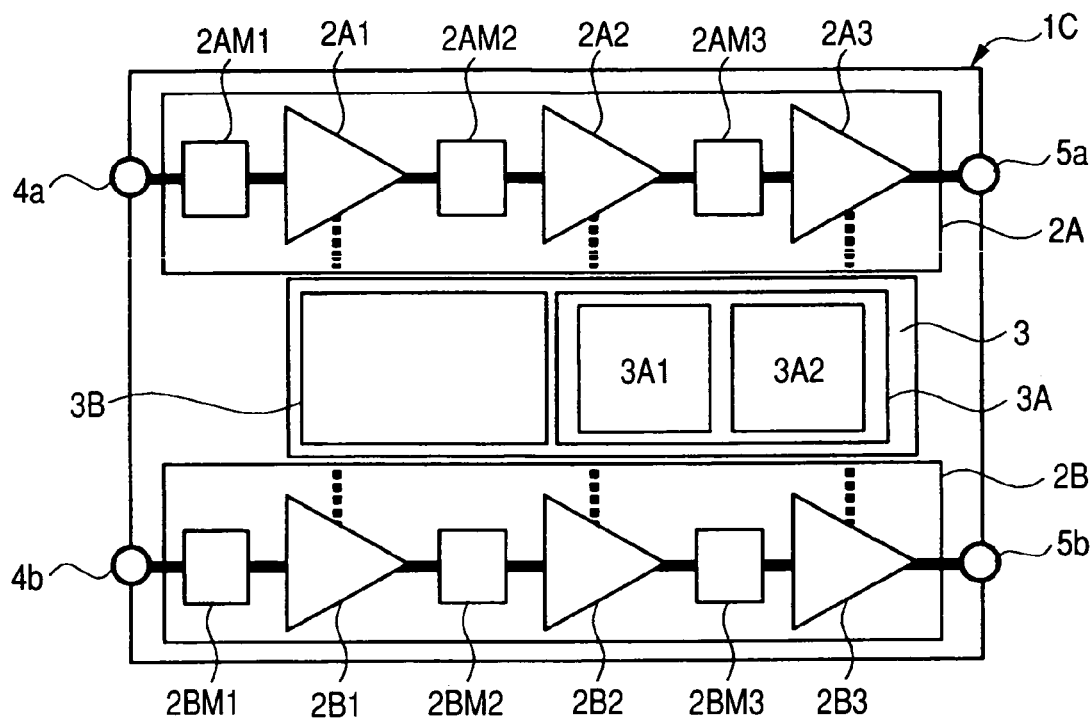
FIG. 3 is a circuit block diagram of an IC chip for amplifier circuit constituting an RF power module.

FIG. 3 is a circuit block diagram of an IC (Integrated Circuit) chip 1C for amplifier circuit which constitutes an RF (Radio Frequency) power module. FIG. 3 is a circuit block diagram of an IC chip using two frequency bands (dual band system) of, for example, GSM900 and DCS1800, and using two communication systems of a GMSK (Gaussian filtered Minimum Shift Keying) modulation system and an EDGE (Enhanced Data GSM Environment) modulation system at each frequency band.

The IC chip 1C has a power amplifier circuit 2A for GSM900, a power amplifier circuit 2B for DCS1800, and a peripheral circuit 3 which effects control, compensation and the like on amplifying operations of the those power amplifier circuits 2A and 2B. The power amplifier circuits 2A and 2B may respectively have three amplifying stages 2A1 through 2A3 and 2B1 through 2B3 and three matching circuits 2AM1 through 2AM3 and 2BM1 through 2BM3. In other words, input terminals 4a and 4b of the IC chip 1C are electrically connected to inputs of the amplifying stages 2A1 and 2B1, each corresponding to a first stage, via the input matching circuits 2AM1 and 2BM1, while the outputs of the amplifying stages 2A1 and 2B1, each corresponding to the first stage, are electrically connected to the inputs of the amplifying stages 2A2 and 2B2, each corresponding to a second stage, via the inter-stage matching circuits 2AM2 and 2BM2. The outputs of the second-stage amplifying stages 2A2 and 2B2 are electrically connected to the inputs of the final-stage amplifying stages 2A3 and 2B3 via the inter-stage matching circuits 2AM3 and 2BM3. The outputs of the final-stage amplifying stages 2A3 and 2B3 are electrically connected to the output terminals 5a and 5b.

The peripheral circuit 3 has a control circuit 3A and a bias circuit 3B which applies a bias voltage to each of the amplifying stages 2A1 through 2A3 and 2B1 through 2B3. The control circuit 3A is a circuit which generates a desired voltage to be applied to each of the power amplifier circuits 2A and 2B and has a power supply control circuit 3A1 and a bias voltage generating circuit 3A2. The power supply control circuit 3A1 is a circuit for generating a first power supply voltage to be applied to each of drain terminals of power MISFETs (LDMISFETs) in the amplifying stages 2A1 through 2A3 and 2B1 through 2B3. Also, the bias voltage generating circuit 3A2 is a circuit for generating a first control voltage for controlling the bias circuit 3B. According to this Embodiment 1, when the power supply control circuit 3A1 generates the first power supply voltage, based on an output level designation signal supplied from a baseband circuit provided outside the IC chip 1C, the bias voltage generating circuit 3A2 generates the first control voltage, based on the first power supply voltage generated by the power supply control circuit 3A1. The baseband circuit is a circuit for generating the output level designation signal. The output level designation signal may be a signal for designating output levels of the power amplifier circuits 2A and 2B and is generated based on the distance between a cellular phone and a base station, that is, the intensity of a radio wave.

Figure 4:
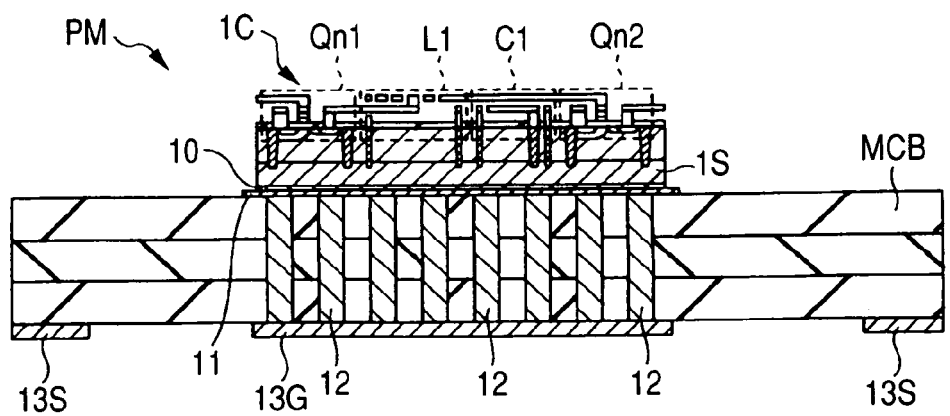
FIG. 4 is a cross-sectional view illustrating one cross-section of an RF power module.

FIG. 4 is a cross-sectional view illustrating one cross-section of an RF power module PM having the IC chip 1C mounted on a module board MCB. In FIG. 4, the IC chip 1C is mounted while the back surface of the substrate 1S is directed to the main surface of the module board MCB. The IC chip 1C has, as described above, the power amplifier circuits 2A and 2B and peripheral circuit 3 formed. For example, LDMISFET Qn1 constituting the amplifying stage 2A1 of the power amplifier circuit 2A, inductor (passive element) L1 and capacitor (passive element) C1 constituting the matching circuit 2AM2, and LDMISFET Qn2 constituting the amplifying stage 2A2 of the power amplifier circuit 2A are illustrated in FIG. 4.

A backside electrode 10 of the IC chip 1C is bonded to a chip mounting electrode 11 formed over a module board MCB. This electrode 11 is electrically and thermally bonded to a backside electrode 13G of the module board MCB via a plurality of thermal vias 12. The backside electrode 13G is supplied with a reference potential (for example, ground potential GND, i.e., about 0V). In other words, the reference potential supplied to the electrode 13G of the module board MCB is supplied to the substrate 1S through the thermal vias 12 and the electrode 11. Heat generated upon the operation of the IC chip 1C is transferred via the electrode 11 and the thermal vias 12 from the back surface of the substrate 1S to the backside electrode 13G of the module board MCB, from which the heat is dissipated. Electrodes 13S formed in the vicinity of the outer periphery of the back surface of the module board MCB indicate signal electrodes. Incidentally, the module board MCB has a multi-layered wiring structure formed by stacking a plurality of insulator plates one after another and integrating them. Although the insulator plates are each made of ceramics, such as alumina (aluminum oxide: $Al_2O_3$ and dielectric constant=9 to 9.7) having a small dielectric loss up to, for example, a millimeter wave region, the present invention is not limited to it. Various changes may be made thereto and a glass epoxy resin may be used.

Figure 5:
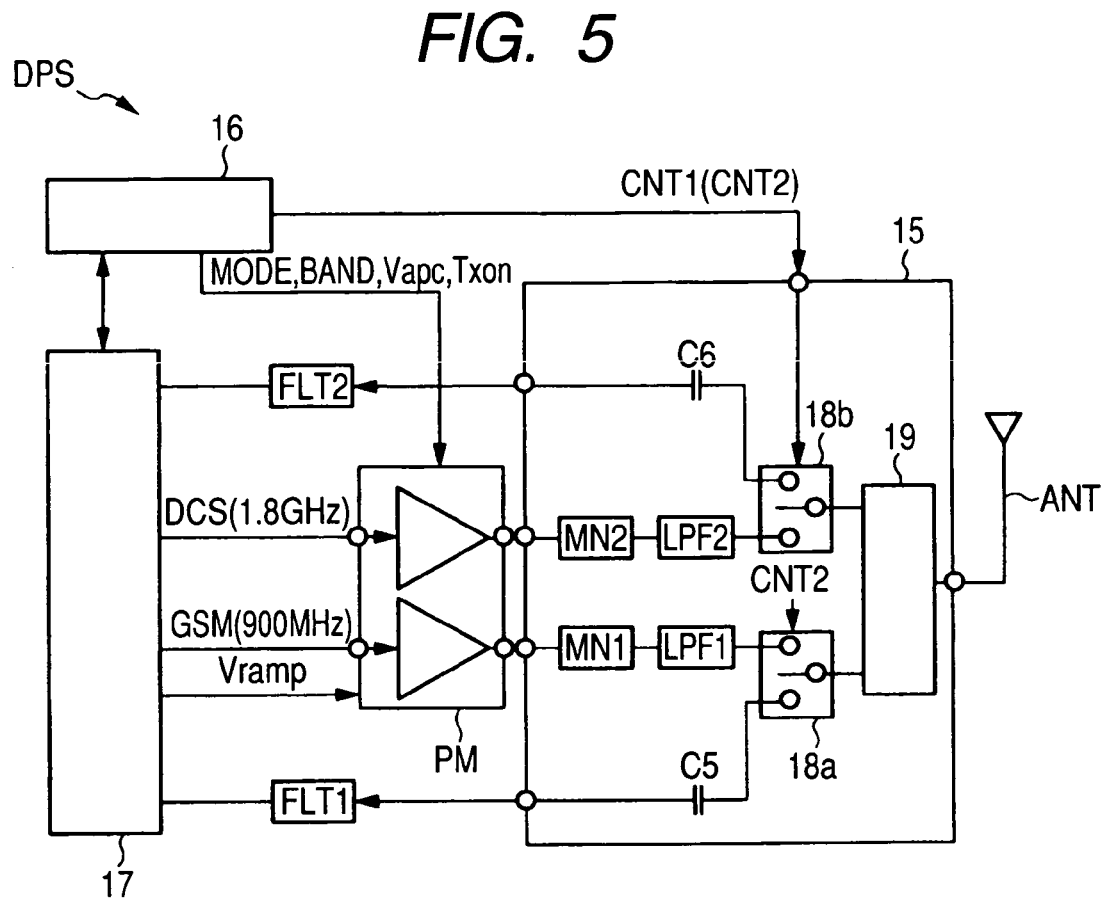
FIG. 5 illustrates one example of a digital mobile phone system using an RF power module.
Figure 11:
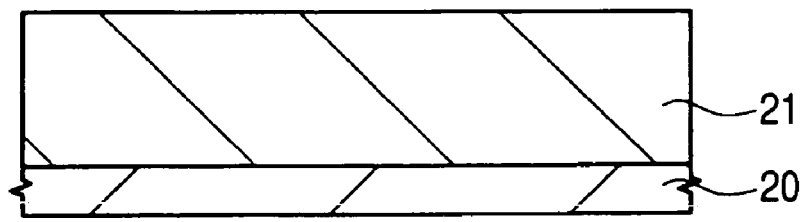
FIG. 11 is a cross-sectional view illustrating a manufacturing step of the semiconductor device according to Embodiment 1.

FIG. 5 illustrates one example of a digital cellular phone system DPS using the RF power module PM according to Embodiment 1. Sign ANT in FIG. 11 indicates a signal wave transmitting/receiving antenna; reference numeral 15 indicates a frontend module; reference numeral 16 indicates a baseband circuit. The baseband circuit 16 has a function of converting an audio signal to a baseband signal or converting a receive signal to an audio signal. The baseband circuit 16 has, in addition, a function of generating a modulation scheme switching signal or a baseband switching signal.

Reference numeral 17 indicates a modulator-demodulator having a function of down-converting a receive signal to demodulate it, thereby generating a baseband signal or a function of generating a transmit signal. Signs FLT1 and FLT2 indicate filters for eliminating noise and the like from a receive signal. The filter FLT1 is used for GSM, while the filter FLT2 is used for DCS.

The baseband circuit 16 is composed of a plurality of semiconductor integrated circuits such as DSP (Digital Signal Processor), microprocessor and semiconductor memory. The frontend module 15 has impedance matching circuits MN1 and MN2, low pass filters LPF1 and LPF2, switch circuits 18a and 18b, capacitors C5 and C6 and a duplexer 19.

The impedance matching circuits MN1 and MN2 are connected to transmission output terminals of the RF power module PM to perform impedance matching. The low pass filters LPF1 and LPF2 are circuits for attenuating higher harmonics; the switch circuits 18a and 18b are transmission/reception changeover switch circuits; the capacitors C5 and C6 are elements for cutting DC components from a receive signal, and the duplexer 19 is a circuit for branching a signal lying in the GSM900 band from a signal lying in the DCS1800 band.

These circuits and elements illustrated in FIG. 5 are mounted on one wiring board so as to be configured as a module. Incidentally, changeover signals CNT1 and CNT2 of the switch circuits 18a and 18b are supplied from the baseband circuit 16.

Figure 6:
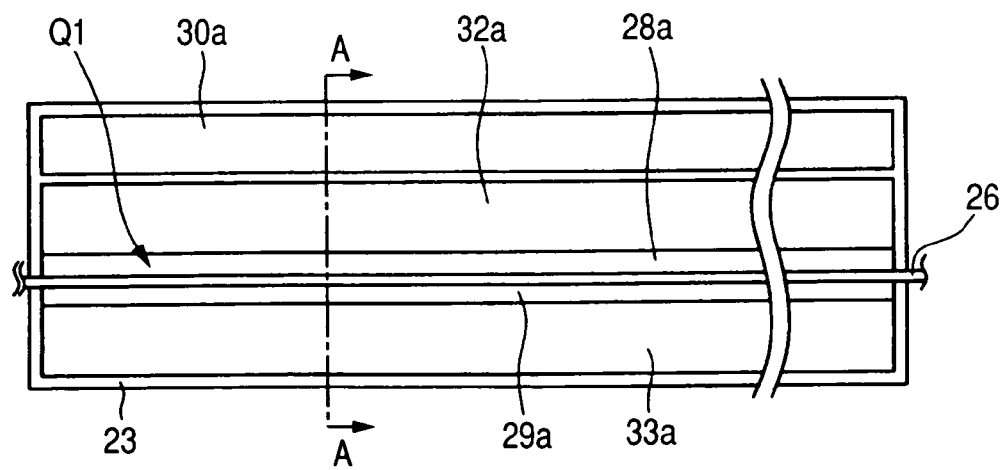
FIG. 6 is a plan view illustrating the schematic constitution of an MISFET (semiconductor device) according to Embodiment 1 of the present invention.

The MISFET according to Embodiment 1 will next be described. The MISFET of this Embodiment 1 is used for, for example, the peripheral circuit 3 illustrated in FIG. 3. FIG. 6 is a schematic plain view of an MISFET Q1 of Embodiment 1. In FIG. 6, a gate electrode 26 extends over a region encompassed by an element isolation region 23. On the side of this gate electrode 26, an n type strained silicon layer 28a or an n type strained silicon layer 29a is formed. An $n^+$ type strained silicon layer 32a is formed outside the n type strained silicon layer 28a, while an $n^+$ type strained silicon layer 33a is formed outside the n type strained silicon layer 29a. A $p^+$ type strained silicon layer 30a is formed outside the $n^+$ type strained silicon layer 32a with the element isolation region 23 sandwiched therebetween. From FIG. 6, an interconnect layer, sidewall spacers formed over the side walls of the gate electrode 26, and a cobalt silicide film formed over the $n^+$ type strained silicon layer 32a and $n^+$ type strained silicon layer 33a are omitted.

Figure 7:
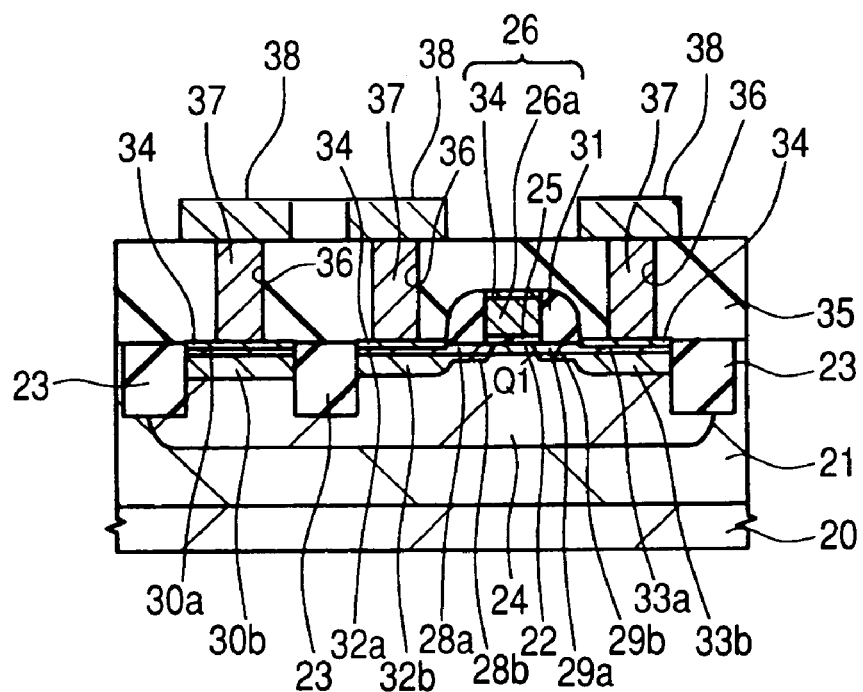
FIG. 7 is a cross-sectional view taken along a line A-A of FIG. 6.

FIG. 7 is a cross-sectional view taken along a line A-A of FIG. 6. In FIG. 7, a $p^-$ type silicon-germanium layer 21 is formed over a $p^-$ type semiconductor substrate 20 obtained by introducing a p type impurity (such as boron) into silicon. In this $p^-$ type silicon-germanium layer 21, a p type silicon-germanium layer 24 is formed. A p type strained silicon layer 22 is formed over the p type silicon-germanium layer 24. This p type strained silicon layer 22 and the p type silicon-germanium layer 24 constitute a p well.

In the lower layer region of the $p^-$ type silicon-germanium layer 21, amounts of germanium to be added to silicon are changed stepwise from 0% to 15%. This makes it possible to positively generate crystal defects in the lower layer region of the $p^-$ type silicon-germanium layer 21, thereby relaxing a strain caused by a difference in a lattice constant between silicon and germanium. The upper layer region of the $p^-$ type silicon-germanium layer 21 and p type silicon-germanium layer 24, the amount of germanium to be added to silicon is almost fixed to 15%. The strain is almost completely relaxed and crystal defects scarcely exist.

A p type silicon layer is formed over the p type silicon-germanium layer 24. Since the lattice constant of this p type silicon layer is different from that of the p type silicon-germanium layer 24, a strain occurs in the p type silicon layer and the p type silicon layer becomes a p type strained silicon layer 22.

In an active region of the p type strained silicon layer 22, that is, a region separated by an element isolation region 23, the MISFET Q1 according to Embodiment 1 is formed. This MISFET Q1 has a gate insulating film 25 formed over the p type strained silicon layer 22 and a gate electrode 26 formed over the gate insulating film 25. The gate insulating film 25 is made of, for example, a silicon oxide film. Instead, the gate insulating film 25 may be made of a so-called High-k film having a higher dielectric constant than a silicon oxide film. The gate electrode 26 has, for example, a polysilicon film 26a and a cobalt silicide film 24 stacked one after another in order to decrease a resistance. The film to be stacked is not limited to the cobalt silicide film 34 but instead, a titanium silicide film or nickel silicide film may be used.

Sidewall spacers 31 are formed over the side walls of the gate electrode 26. The sidewall spacers 31 are made of, for example, a silicon oxide film. Below one of the side walls 31, an n type strained silicon layer 28a and n type silicon-germanium layer 28b are formed, while below the other side wall 31, an n type strained silicon layer 29a and an n type silicon-germanium layer 29b are formed. An n type impurity such as phosphorus (P) has been introduced into the n type strained silicon layer 28a and n type silicon-germanium layer 28b. By these n type strained silicon layer 28a and n type silicon-germanium layer 28b, an extension region which is a portion of the source region is formed. Similarly, an extension region which is a portion of the drain region is formed by the n type strained silicon layer 29a and n type silicon-germanium layer 29b.

An $n^+$ type strained silicon layer 32a and an $n^+$ type silicon-germanium layer 32b are formed outside the extension region made of the n type strained silicon layer 28a and n type silicon-germanium layer 28b. The $n^+$ type strained silicon layer 32a is more highly doped with an n type impurity than the n type strained silicon layer 28a and at the same time, the $n^+$ type silicon-germanium layer 32b is more highly doped with an n type impurity than the n type silicon-germanium layer 28b. An impurity diffusion region which will be a portion of the source region is formed by these $n^+$ type strained silicon layer 32a and $n^+$ type silicon-germanium layer 32b. In other words, the source region is made of the extension region and impurity diffusion region. The extension region of the source region is shallower than the impurity diffusion region formed outside of the extension region.

Similarly, outside the extension region made of the n type strained silicon layer 29a and n type silicon-germanium layer 29b, an impurity diffusion region made of the $n^+$ type strained silicon layer 33a and the $n^+$ type silicon-germanium layer 33b is formed. The drain region is also made of the extension region and impurity diffusion region having a higher impurity concentration than the extension region. The extension region of the drain region is also shallower than the impurity diffusion region formed outside of the extension region.

A cobalt silicide film 34 is formed over the $n^+$ type strained silicon layer 32a and this cobalt silicide film 34 constitutes a portion of the source region. Similarly, the cobalt silicide film 34 is formed over the $n^+$ type strained silicon layer 33a and this cobalt silicide film 34 also constitutes a portion of the drain region.

An insulating film 35 which will be an interlayer insulating film is formed over the MISFET Q1, and this insulating film 35 has a contact hole 36 formed therein. A conductive material such as tungsten is filled in this contact hole 36 to form a plug 37. This plug 37 is made of, for example, a barrier film made of a titanium or titanium nitride film and a tungsten film. An interconnect 38 electrically connected to the plug 37 is formed over this plug 37. This interconnect 38 is made of, for example, an aluminum film.

Figure 8:
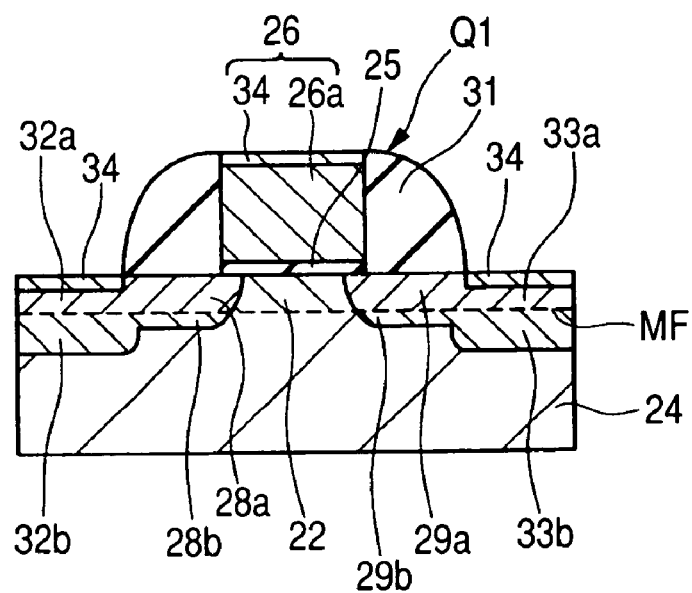
FIG. 8 is a partially enlarged cross-sectional view of FIG. 7.

FIG. 8 is an enlarged view of the MISFET Q1 of FIG. 7. In FIG. 8, the p type strained silicon layer 22 is formed over the p type silicon-germanium layer 24. This p type strained silicon layer 22 has a thickness of about 50 nm. A ratio (concentration) of germanium in this p type silicon-germanium layer 24 is 15%. As can be understood from FIG. 1, when the ratio of germanium is 15%, the critical film thickness at which misfit dislocations MF occur on the interface between the p type strained silicon layer 22 and p type silicon-germanium layer 24 is about 25 nm. The thickness of the p type strained silicon layer 22 in this case is about 50 nm, greater than the critical film thickness at which misfit dislocations MF occur. The misfit dislocations MF have therefore appeared in the vicinity of the interface between the p type strained silicon layer 22 and p type silicon-germanium layer 24.

It was considered before that when misfit dislocations MF occurred, a leak current was caused via the misfit dislocations MF themselves. The thickness of the p type strained silicon layer 22 formed over the p type silicon-germanium layer 24 was therefore adjusted to not greater than the critical film thickness to prevent generation of misfit dislocations MF. According to the test by the present inventors, however, it has been confirmed that the misfit dislocations themselves are electrically inactive. This means that misfit dislocations do not cause an increase in a leak current compared with a case where no misfit dislocation occurs. Accordingly, existence of misfit dislocations MF at any junction portion of the MISFET Q1 causes no problem.

In the MISFET Q1 of Embodiment 1, the p type strained silicon layer 22 is made thicker than the critical film thickness. Following advantages are available by such an increase in the thickness of the p type strained silicon layer 22.

The strain of the p type strained silicon layer 22 formed by the epitaxial growth over the strained-relaxed p type silicon-germanium layer 24 is maintained at almost a fixed magnitude until its thickness reaches about 4 times as much as the critical film thickness at which generation of misfit dislocations starts. Even in the p type strained silicon layer thicker than the critical film thickness, the improving effect of electron mobility by strain can be kept as is. In other words, it is possible to improve electron mobility by using the p type strained silicon layer 22 thicker than the critical film thickness for the channel region of the MISFET Q1. When a ratio of germanium in the p type silicon-germanium layer 24 is 10% or greater, the electron mobility of the p type strained silicon layer 22 formed over the p type silicon-germanium layer 24 becomes at least twice as much as that of an ordinary silicon layer.

Since the p type strained silicon layer 22 is thicker than the critical film thickness, it is possible to prevent diffusion of germanium from the p type silicon-germanium layer 24 formed below the p type strained silicon layer 22 from extending to the surface (channel region) of the p type strained silicon layer 22. Accordingly, a decrease in electron mobility which will otherwise occur by the diffusion of germanium into the channel region of the MISFET Q1 can be suppressed. In other words, when the p type strained silicon layer 22 is thin, germanium diffused from the underlying p type silicon-germanium layer 24 reaches even the surface of the p type strained silicon layer 22 and mobility of electrons flowing through the channel lowers. In this Embodiment 1, however, the thickened p type strained silicon layer 22 can inhibit a reduction in electron mobility due to germanium diffusion.

In addition, since the p type strained silicon layer 22 is made thicker than the critical film thickness, minute unevenness in the thickness of the p type strained silicon layer 22 does not lead to unevenness in the transistor characteristics of the MISFET Q1. A decrease in the yield of non-defective products, which will otherwise occur by minute unevenness in the thickness of the p type strained silicon layer 22, can therefore be inhibited. In other words, owing to an increase in the thickness of the p type strained silicon layer 22, an influence of minute unevenness in the film thickness can be made relatively small compared with the case where the p type strained silicon layer 22 is thin.

Moreover, this strained silicon technology can be applied to an MISFET which must increase the thickness of the gate insulating film 25 in order to satisfy the request for high breakdown voltage. Since the p type strained silicon layer 22 has an increased thickness, the p type strained silicon layer 22 still has a sufficient film thickness even after the p type strained silicon layer is thinned by the formation of the gate insulating film 25. This strained silicon technology can thus be applied to the case where high breakdown voltage is required. In other words, the gate insulating film 25 is usually formed by thermal oxidation. At this time, the gate insulating film 25 is formed as if it eats away the p type strained silicon layer 22. The MISFET with high breakdown voltage must have a relatively thick gate insulating film 25 so that a reduction in the thickness of the p type strained silicon layer 22 relatively increases. In this Embodiment 1, however, the p type strained silicon layer 22 can be thickened sufficiently so that the p type strained silicon layer 22 has still an enough thickness in spite of a reduction in the film thickness.

In addition, since the p type strained silicon layer 22 is thick, the source and drain regions can be thickened by several times as much as the conventional ones. This leads to a reduction in the parasitic resistance of the source and drain regions. In the related art, the film thickness of the p type strained silicon layer 22 must be not greater than critical film thickness to avoid generation of misfit dislocations. The upper limit of the film thickness of the source and drain regions was about critical film thickness. In this Embodiment 1, however, the p type strained silicon layer 22 has a thickness several times as much as that of the critical film thickness so that the source and drain regions can be thickened and parasitic resistance can be reduced.

A cobalt silicide film 34 is formed over the source and drain regions for the purpose of reducing resistance. This cobalt silicide layer 34 is formed by silicidation of the surface of the $n^+$ type strained silicon layer 32a and $n^+$ type strained silicon layer 33a. In other words, the cobalt silicide film 34 is formed by consuming the $n^+$ type strained silicon layer 32a and $n^+$ type strained silicon layer 33a as if it eats them up. In the related art, since the $n^+$ type strained silicon layers 32a and 33a are thin, the silicidation extends even to the $n^+$ type silicon-germanium layers 32b and 33b below the $n^+$ type strained silicon layers 32a and 33a and an abnormal reaction occurs when the silicide reaction is effected without any pre-treatment. With a view to overcoming this problem, a strained silicon layer is added by the selective epitaxial growth over the $n^+$ type strained silicon layers 32a and 33a, which complexes the manufacturing process. In this Embodiment 1, on the other hand, the $n^+$ type strained silicon layers 32a and 33a having enough thickness prevent the silicidation from reaching the underlying $n^+$ type silicon-germanium layers 32b and 33b. In this Embodiment 1, the manufacturing method can be simplified because no strained silicon layer is accumulated over the $n^+$ type strained silicon layers 32a and 33a.

By adjusting the thickness of the p type strained silicon layer 22 or $n^+$ type strained silicon layers 32a and 33a to be thicker than the critical film thickness, the above-described effect is achieved and in addition, a leak current does not increase through the misfit dislocations MF themselves, if any. The misfit dislocations MF themselves do not increase a leak current, but it is known that they will be a path for impurity diffusion. When there exist misfit dislocations MF, consideration must be given to the path for impurity diffusion.

Figure 9:
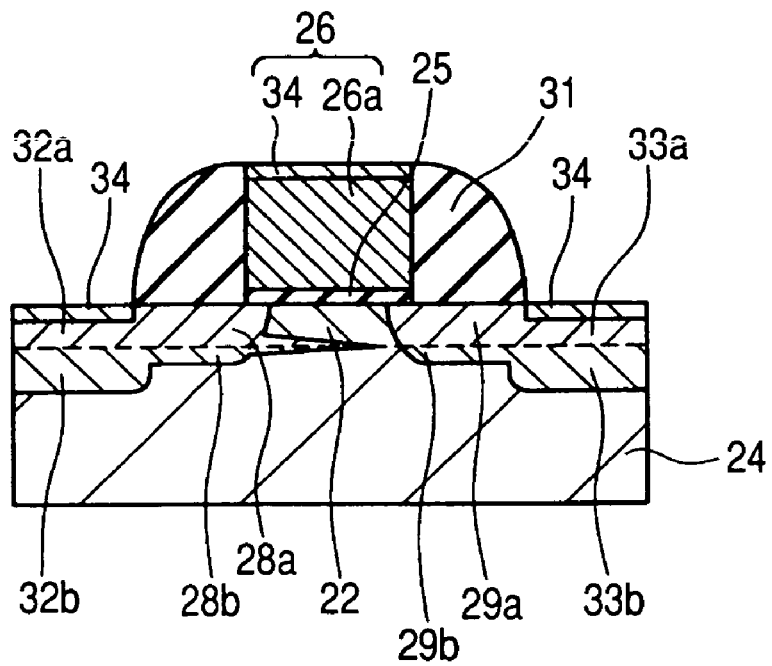
FIG. 9 is a schematic cross-sectional view illustrating how impurity diffusion occurs via misfit dislocations.

FIG. 9 illustrates how misfit dislocations MF exist on the interface between the p type strained silicon layer 22 and p type silicon-germanium layer 24. FIG. 9 suggests that an n type impurity is diffused into the drain region via misfit dislocations MF from the n type strained silicon layer 28a and n type silicon-germanium layer 28b constituting the extension region of the source region. Thus, the misfit dislocations MF become a path for impurity diffusion. In FIG. 9, diffusion of an impurity narrows the distance between the source region and drain region and a leak current occurs owing to this impurity diffusion. The present inventors have found by a test that generation of a leak current owing to the narrowing of the distance between the source region and drain region by impurity diffusion occurs only in the below-described case.

It occurs only when the misfit dislocations MF lie in a region in which the source region and drain region are closest to each other, that is, in a region between a portion of the source region below the end of the gate electrode 26 and a portion of the drain region below the end of the gate electrode 26. The present inventors have found that the presence or absence of a leak current depends on an impurity concentration of the source region and drain region below the end of the gate electrode 26 at which the misfit dislocations MF lie.

Most of the misfit dislocations MF exist in the vicinity of the interface between the strained silicon layer (including the p type strained silicon layer 22, n type strained silicon layers 28a and 29a, and the $n^+$ type strained silicon layers 32a and 33a) and the silicon-germanium layer (including the p type silicon-germanium layer 24, n type silicon-germanium layers 28b and 29b, and $n^+$ type silicon-germanium layers 32b and 33b) so that a position in the depth direction at which the impurity concentration is to be monitored can be considered as the interface between the strained silicon layer and silicon germanium layer.

Figure 10:
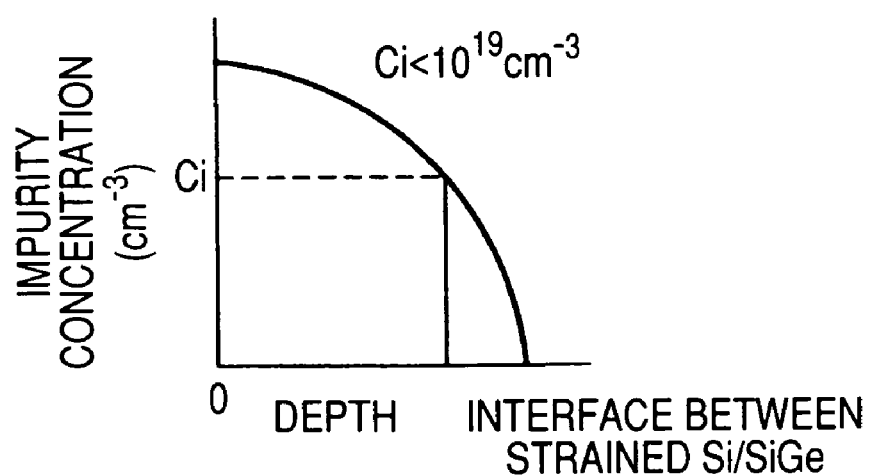
FIG. 10 is a graph illustrating the relationship between the depth from the surface of a semiconductor substrate and impurity concentration.

FIG. 10 shows the relationship between the depth below the end of the gate electrode 26 and the impurity concentration. In FIG. 10, supposing that Ci represents an impurity concentration on the interface between the strained silicon layer and silicon-germanium layer, it has been revealed that impurity diffusion via the misfit dislocations MF can be suppressed by adjusting this impurity concentration Ci to not greater than $1 \times 10^{19}$ cm$^{-3}$. In other words, impurity diffusion can be suppressed by adjusting an n type impurity concentration in the source region (extension region) and drain region (extension region) below the end of the gate electrode 26 to not greater than $1 \times 10^{19}$ cm$^{-3}$. Impurity diffusion can be suppressed by adjusting the impurity concentration to not greater than a predetermined value, because diffusion tends to occur at a higher impurity concentration.

The impurity concentration in the source and drain regions usually lowers as an increase in the depth from the surface. The above-described conditions can be satisfied if the thickness of the n type strained silicon layers 28a and 29a is adjusted to a predetermined value or greater. In the MISFET of Embodiment 1 illustrated in FIGS. 7 and 8, the impurity concentration on the interface between the strained silicon layer and silicon-germanium layer below the end of the gate electrode 26 is, for example, $1 \times 10^{18}$ cm$^{-3}$, lower than the above-described value: $1 \times 10^{19}$ cm$^{-3}$.

Figure 2:
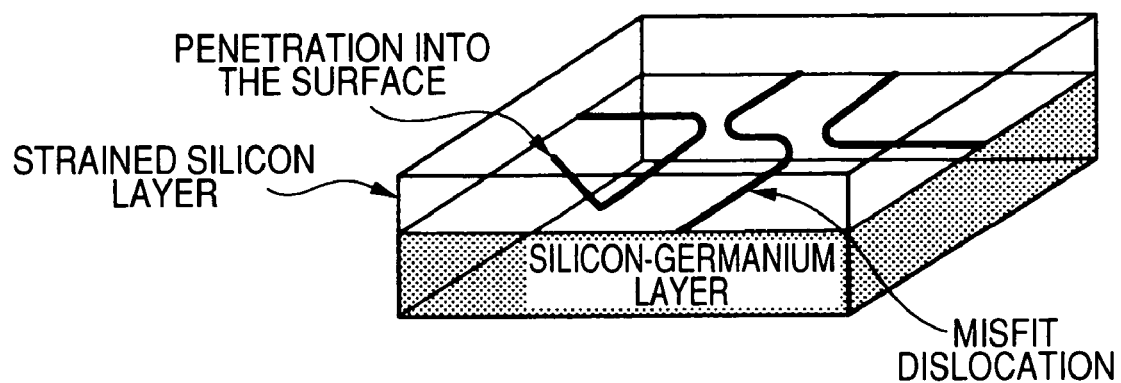
FIG. 2 is a schematic view illustrating misfit dislocations.

It has been confirmed based on the results of the test that intrusion of the misfit dislocations MF into the strained silicon layer (refer to FIG. 2), which occurs at a certain probability, does not lead to an increase in leak current. The intrusion of the misfit dislocations MF may presumably form a path for impurity diffusion. The intrusion of the misfit dislocations MF is formed in a substantially vertical direction from the interface between the strained silicon layer and silicon-germanium layer toward the surface of the strained silicon layer. Accordingly, impurity diffusion from the source or drain region once occurs downward and after arrival at the interface between the strained silicon layer and silicon-germanium layer, it moves in a horizontal direction. Impurity diffusion so brisk as to cause a leak current therefore does not occur in consideration of the necessity of a very long distance for connecting the source region and the drain region.

A manufacturing method of the MISFET Q1 of the present invention will next be described based on accompanying drawings.

As illustrated in FIG. 11A, a p⁻ type semiconductor substrate 20 is prepared by introducing a p type impurity (such as boron) into silicon at a low concentration. A p⁻ type silicon-germanium layer 21 is formed over this p⁻ type semiconductor substrate 20. This p⁻ type silicon-germanium layer 21 can be formed, for example, by using CVD (Chemical Vapor Deposition). This p⁻ type silicon-germanium layer 21 is obtained by causing the growth of about 1 µm while increasing stepwise a ratio of germanium from 0% to 15% and then causing the growth of about 1 µm while keeping the ratio of germanium at 15%.

Figure 12:
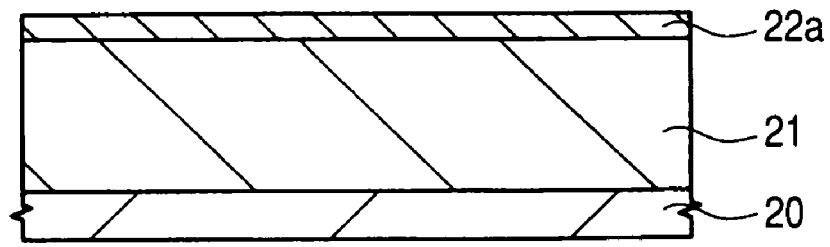
FIG. 12 is a cross-sectional view illustrating a manufacturing step of the semiconductor device following that of FIG. 11.

As illustrated in FIG. 12, a p⁻ type silicon layer is then formed over the p⁻ type silicon-germanium layer 21. This p⁻ type silicon layer is formed using, for example, epitaxial growth and its thickness is adjusted to, for example, about 65 nm. This p⁻ type silicon layer will be a p⁻ type strained silicon layer 22a. The concentration of germanium of the p⁻ type silicon-germanium layer 21 is 15% and the critical film thickness at which no misfit dislocations occurs is, as is apparent from FIG. 1, about 25 nm. In this case, the p⁻ type strained silicon layer 22a formed over the p⁻ type silicon-germanium layer 21 has a thickness of about 65 nm which exceeds the critical film thickness. Misfit dislocations therefore appear in the vicinity of the interface between the p⁻ type silicon-germanium layer 21 and the p⁻ type strained silicon layer 22a.

Figure 13:
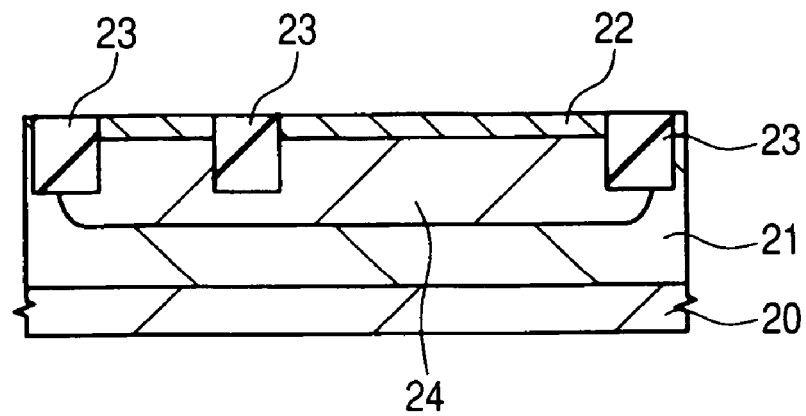
FIG. 13 is a cross-sectional view illustrating a manufacturing step of the semiconductor device following that of FIG. 12.

Boron (B) is then introduced into the p⁻ type silicon-germanium layer 21 and the p⁻ type strained silicon layer 22a by using photolithography and ion implantation, followed by heat treatment, whereby a p type silicon-germanium layer 24 and p type strained silicon layer 22 are formed as illustrated in FIG. 13.

After an element isolation trench is formed by using photolithography and etching, a silicon oxide film is formed over the p⁻ type semiconductor substrate 20 so as to fill it in this element isolation trench. The silicon oxide film thus formed is then polished by CMP (Chemical Mechanical Polishing) to form an element isolation region 23. In other words, the element isolation region 23 having the silicon oxide film filled only in the element isolation trench is formed by removing the silicon oxide film formed in a region other than the element isolation trench.

Figure 14:
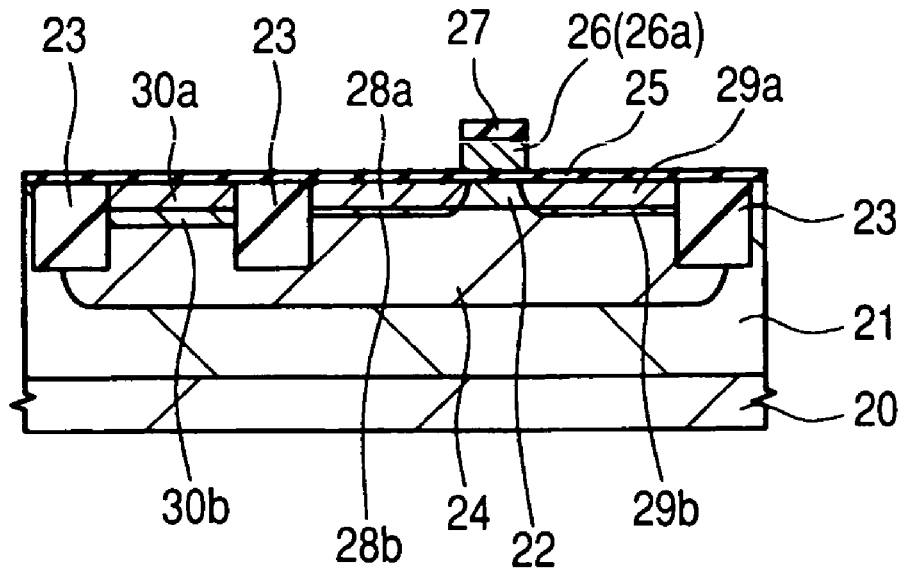
FIG. 14 is a cross-sectional view illustrating a manufacturing step of the semiconductor device following that of FIG. 13.

Boron is introduced into the p type strained silicon layer 22 and p type silicon-germanium layer 24 by making use of photolithography and ion implantation, followed by heat treatment, whereby a p⁺ type strained silicon layer 30a and p⁺ type silicon-germanium layer 30b are formed as illustrated in FIG. 14.

A gate insulating film 25 made of, for example, a silicon oxide film is then formed over the main surface of the p⁻ type semiconductor substrate 20 by making use of thermal oxidation. A polysilicon film 26a is then formed over the gate insulating film 25, followed by the formation of a silicon oxide film 27 over this polysilicon film 26a. The polysilicon film 26a and silicon oxide film 27 can be formed using, for example, CVD.

By making use of photolithography and etching, the polysilicon film 26a and silicon oxide film 27 are patterned. By this patterning, a gate electrode 26 made of the polysilicon film 26a can be formed.

An n type impurity such as phosphorus is introduced into the p type strained silicon layer 22 and silicon-germanium layer 24 by making use of photolithography and ion implantation, followed by heat treatment, whereby n type strained silicon layers 28a and 29a, and n type silicon-germanium layers 28b and 29b are formed in alignment with the gate electrode 26. Here, an extension region of the source region is formed by the n type strained silicon layer 28a and n type silicon-germanium layer 28b, while an extension region of the drain region is formed by the n type strained silicon layer 29a and n type silicon-germanium layer 29b. At this time, the thickness of the strained silicon layer (including p type strained silicon layer 22, n type strained silicon layers 28a and 29a, and p⁺ type strained silicon layer 30a) is reduced from about 65 nm to about 50 nm. Even if the thickness of the strained silicon layer is reduced to about 50 nm, it exceeds the critical film thickness, that is, about 25 nm (about 15 nm when etching by washing in each step or consumption during formation of the gate insulating film 25 is taken into consideration). In short, the strained silicon layer is thicker than the conventional one.

Figure 15:
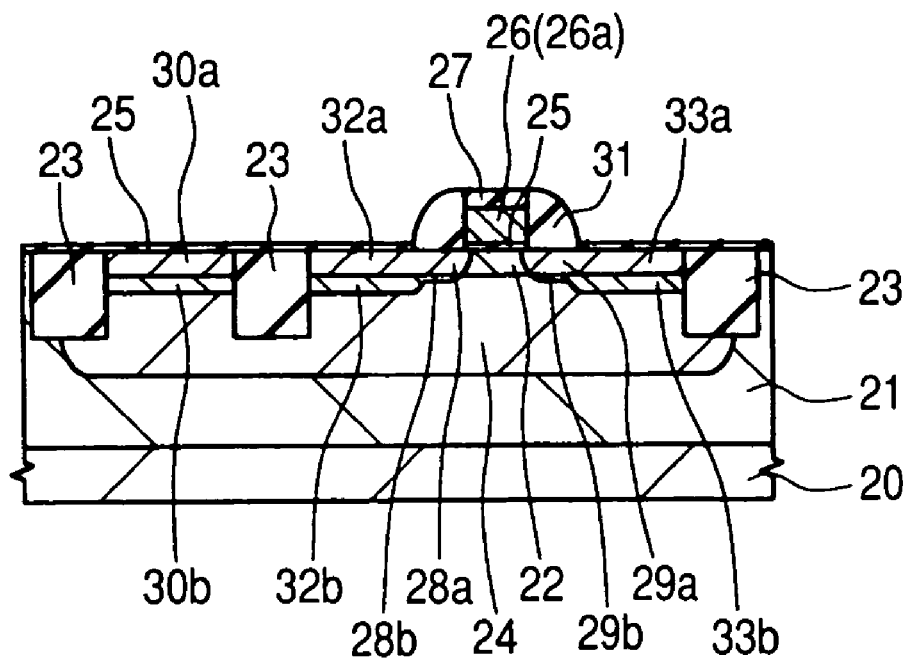
FIG. 15 is a cross-sectional view illustrating a manufacturing step of the semiconductor device following that of FIG. 14.
Figure 16:
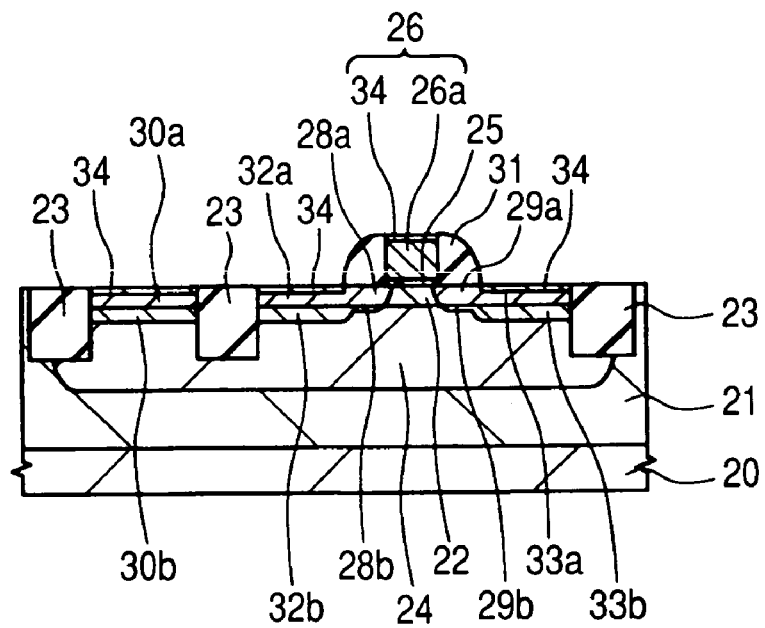
FIG. 16 is a cross-sectional view illustrating a manufacturing step of the semiconductor device following that of FIG. 15.

A silicon oxide film, for example, is then formed over the main surface of the p⁻ type semiconductor substrate 20. This silicon oxide film can be formed using, for example, CVD. As illustrated in FIG. 15, sidewall spacers 31 are formed over the side walls of the gate electrode 26 by anisotropic etching of this silicon oxide film.

An n type impurity such as phosphorus is then introduced by making use of photolithography and ion implantation, followed by heat treatment, whereby n⁺ type strained silicon layers 32a and 33a and n⁺ type silicon-germanium layers 32b and 33b are formed in alignment with the sidewall spacers 31. Here, a portion (impurity diffusion region) of the source region is formed by the n⁺ type strained silicon layer 32a and n⁺ type silicon-germanium layer 32b, while a portion (impurity diffusion region) of the drain region is formed by the n⁺ type strained silicon layer 33a and n⁺ type silicon-germanium layer 33b.

The gate insulating film 25 formed over the n⁺ type strained silicon layers 32a and 33a and the silicon oxide film 27 formed over the gate electrode 26 are then removed. A cobalt film is then formed over the p⁻ type semiconductor substrate 20 including the exposed n⁺ type strained silicon layers 32a and 33a and gate electrode 26. Heat treatment is then given to form a cobalt silicide film 34. This makes it possible to form the cobalt silicide film 34 over the n⁺ type strained silicon layers 32a and 33a and at the same time to form the gate electrode 26 made of the polysilicon film 26a and cobalt silicide film 34.

The MISFET Q1 of Embodiment 1 can be formed in such a manner. A wiring step will next be described.

As illustrated in FIG. 7, an interlayer insulating film 35 made of, for example, a silicon oxide film is formed over the p⁻ type semiconductor substrate 20. This interlayer insulating film 35 can be formed, for example, by CVD. Contact holes 36 reaching the source and drain regions are formed in the interlayer insulating film 35 by using photolithography and etching.

After formation of a titanium/titanium nitride film (not illustrated) over the interlayer insulating film 35 having the contact holes 36 formed therein, a tungsten film is formed over this titanium/titanium nitride film. The titanium/titanium nitride film can be formed, for example, by sputtering, while the tungsten film can be prepared, for example, by CVD.

The titanium/titanium nitride film and tungsten film are left only in the contact holes 36 by removing unnecessary portions of the titanium/titanium nitride film and tungsten film formed over the interlayer insulating film 35 by CMP, whereby plugs 37 can be formed. Over the interlayer insulating film 35 having the plugs 37 formed therein, an aluminum film is formed. The aluminum film can be formed by using, for example, sputtering. The aluminum film is then patterned using photolithography and etching, whereby interconnects 38 are formed.

In such a manner, the interconnects of MISFET Q1 of Embodiment 1 can be formed.

Embodiment 2

In Embodiment 1, an example in which the source and drain regions extend over the strained silicon layer and silicon germanium layer therebelow was described. In Embodiment 2, an example in which the source and drain regions are formed only in a strained silicon layer will be described. A plain view of an MISFET Q2 of Embodiment 2 is similar to that of FIG. 6.

Figure 17:
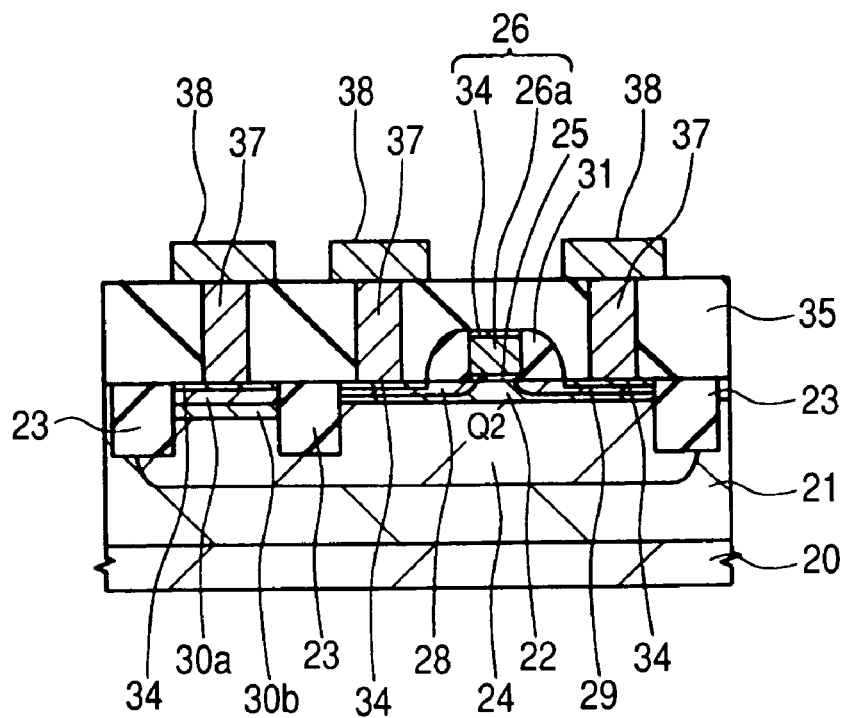
FIG. 17 is a cross-sectional view illustrating a semiconductor device according to Embodiment 2.
Figure 18:
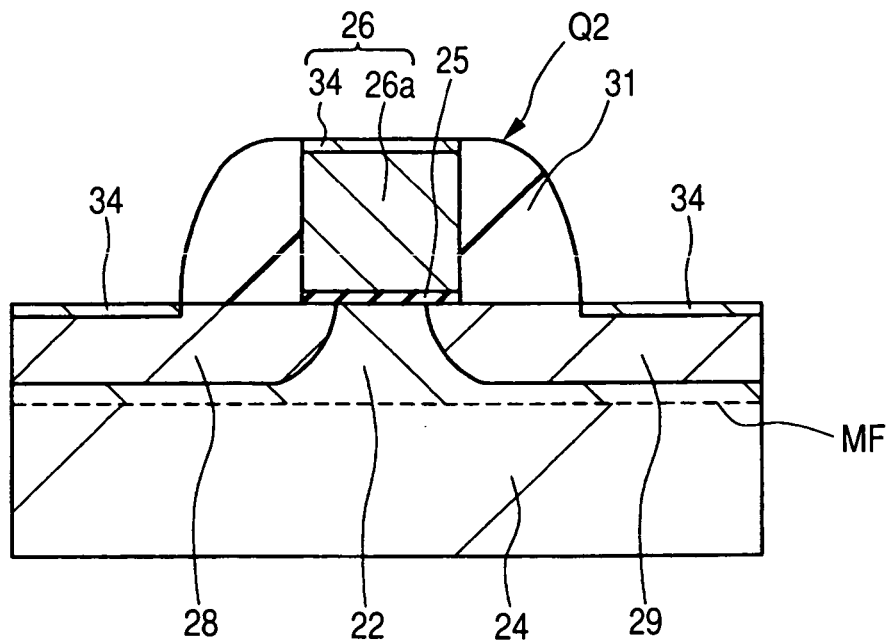
FIG. 18 is a partially enlarged cross-sectional view of FIG. 17.

FIG. 17 is a cross-sectional view illustrating the MISFET Q2 according to Embodiment 2. FIG. 18 is a partially enlarged cross-sectional view of a portion of the MISFET Q2 of FIG. 17. In FIGS. 17 and 18, the constitution of the MISFET Q2 according to Embodiment 2 is substantially similar to that of the MISFET Q1 according to Embodiment 1, so that only the difference in constitution will be described. What is different between Embodiment 1 and Embodiment 2 resides in that the source region is composed of an n type strained silicon layer and a cobalt silicide film 34, while the drain region is composed of an n type strained silicon layer 29 and a cobalt silicide film 34. In other words, in the MISFET Q2 of Embodiment 2, the source and drain regions are formed only in the strained silicon layer (p type strained silicon layer 22) and are not formed in a silicon-germanium layer (p type silicon-germanium layer 24) formed below the strained silicon layer.

In Embodiment 2, the strained silicon layer (p type strained silicon layer 22) has a thickness of about 50 nm and it exceeds the critical film thickness at which no misfit dislocation MF occurs. Accordingly, the misfit dislocations MF appear on the interface between the strained silicon layer (p type strained silicon layer 22) and silicon-germanium layer (p type silicon-germanium layer 24).

The thickness of the source and drain regions is about 40 nm, shallower than the interface between the strained silicon layer (p type strained silicon layer 22) and silicon-germanium layer (p type silicon-germanium layer 24). The thickness of the source and drain regions is however thicker than the conventional critical film thickness at which no misfit dislocation MF occurs, that is, about 15 nm (thickness when etching by washing in each step or consumption during formation of a gate insulating film 25 is taken into consideration). In Embodiment 2, therefore, a similar effect to that attained in Embodiment 1 is available.

The source and drain regions are away from the misfit dislocations MF formed in the vicinity of the interface between the strained silicon layer (p type strained silicon layer 22) and silicon-germanium layer (p type silicon-germanium layer 24) so that they are less influenced by the impurity diffusion via the misfit dislocations MF. As described in Embodiment 1, the impurity diffusion depends on the impurity concentration below the end of the gate electrode 26 and in the vicinity of the interface between the strained silicon layer (p type strained silicon layer 22) and silicon-germanium layer (p type silicon-germanium layer 24). Described specifically, at an impurity concentration not greater than $1 \times 10^{19}$ cm⁻³, impurity diffusion via misfit dislocations MF can be inhibited. In Embodiment 2, it is apparent that the impurity concentration on the interface is not greater than $1 \times 10^{19}$ cm⁻³, because the source and drain regions are away from the misfit dislocations MF. Since the influence of impurity diffusion via misfit dislocations MF is decreased, Embodiment 2 has an effect of actualizing an MISFET having a distance between source and drain regions narrowed, in other words, MISFET having a small gate width.

A manufacturing method of the MISFET Q2 according to Embodiment 2 is almost similar to that according to Embodiment 1. What is different is that the source and drain regions are formed only in the strained silicon layer and they are formed so as not to extend to the silicon-germanium layer lying below the strained silicon layer.

Embodiment 3

In Embodiment 1, the example in which the source and drain regions extend over the strained silicon layer and silicon germanium layer therebelow was described. In Embodiment 3, an example in which an extension region of a source region and an extension region of a drain region are formed only in a strained silicon layer will be described. A plain view of an MISFET Q3 of Embodiment 3 is similar to that of FIG. 6.

Figure 19:
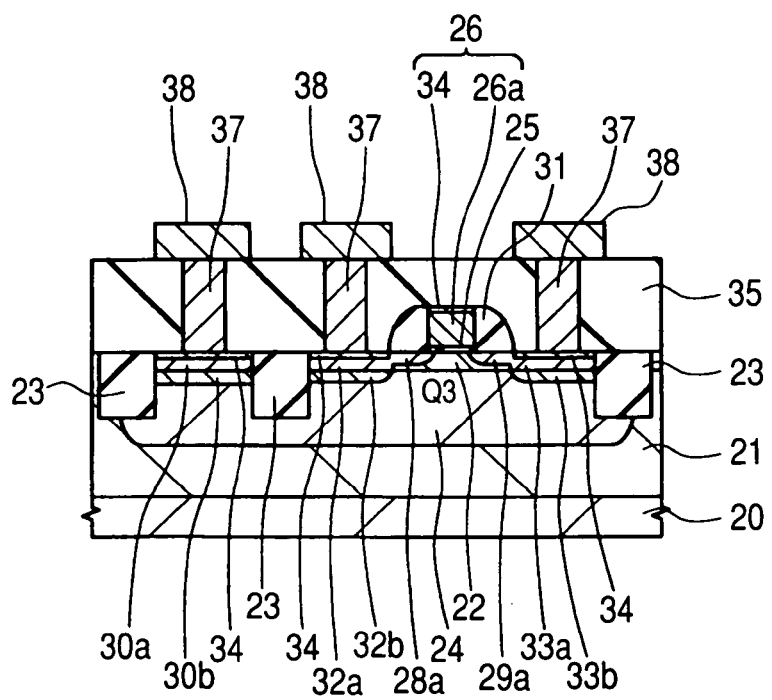
FIG. 19 is a cross-sectional view illustrating a semiconductor device according to Embodiment 3.
Figure 20:
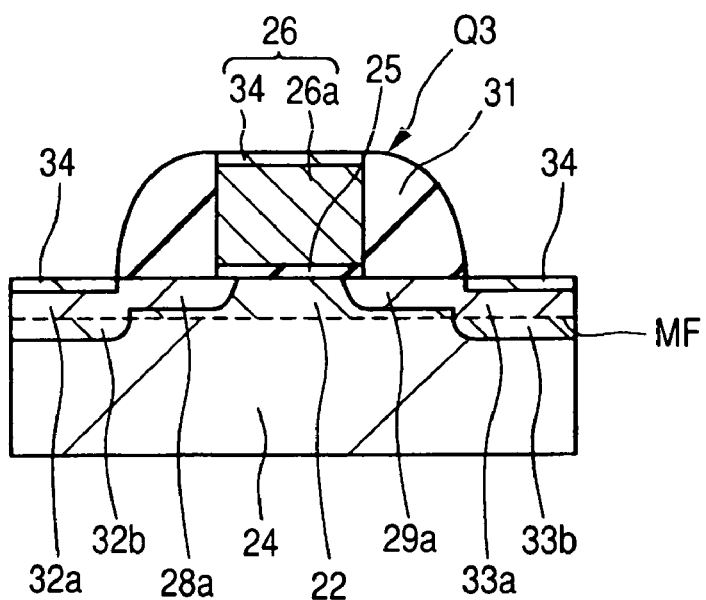
FIG. 20 is a partially enlarged cross-sectional view of FIG. 19.

FIG. 19 is a cross-sectional view illustrating the MISFET Q3 according to Embodiment 3. FIG. 20 is a partially enlarged cross-sectional view of the MISFET Q3 of FIG. 19. In FIGS. 19 and 20, the constitution of the MISFET Q3 according to Embodiment 3 is substantially similar to that of the MISFET Q1 according to Embodiment 1, so that only the difference in constitution will be described. What is different between Embodiment 1 and Embodiment 3 resides in that the extension region of the source region is composed alone of an n type strained silicon layer 28a, while the extension region of the drain region is composed alone of an n type strained silicon layer 29a. In other words, the extension regions are formed only in the strained silicon layers.

The p type strained silicon layer 22 has a thickness of 50 nm, greater than the critical film thickness so that it exceeds the critical film thickness at which no misfit dislocation MF occurs. Misfit dislocations MF therefore occur on the interface between the strained silicon layer and silicon-germanium layer.

The n type strained silicon layers 28a and 29a formed in the p type strained silicon layer 22 have a thickness of about 40 nm so that the extension region (n type strained silicon layer 28a) of the source region and the extension region (n type strained silicon layer 29a) of the drain region are shallower than the interface between the strained silicon layer and silicon-germanium layer. On the other hand, the source region (impurity diffusion region) other than the extension region is made of an $n^+$ type strained silicon layer 32a and an $n^+$ type silicon-germanium layer 32b and is deeper than the interface between the strained silicon layer and silicon-germanium layer. Similarly, the drain region (impurity diffusion region) other than the extension region is made of an $n^+$ type strained silicon layer 33a and $n^+$ type silicon-germanium layer 33b and is deeper than the interface between the strained silicon layer and silicon-germanium layer.

Embodiment 3 is common to Embodiment 2 in that the extension region is formed only in the strained silicon layer so that effects available by this embodiment are similar to those of Embodiment 2.

In addition, it is possible to reduce the parasitic resistance of the source and drain regions, because the source and drain regions other than the extension regions extend to a deeper region than the interface between the strained silicon layer and silicon-germanium layer.

When the source region ($n^+$ type strained silicon layer 32a, $n^+$ type silicon-germanium layer 32b) other than the extension region or the drain region ($n^+$ type strained silicon layer 33a, $n^+$ type silicon-germanium layer 33b) other than the extension region is made deeper than the interface between the strained silicon layer and silicon-germanium layer, impurity diffusion is presumed to occur from this region via the misfit dislocations MF. The source region other than the extension region or drain region other than the extension region is formed away from a region below the end of the gate electrode 26. In other words, the extension region is formed in alignment with the gate electrode 26 so that it exists below the end of the gate electrode 26. The source region other than the extension region or the drain region other than the extension region is formed in alignment with the sidewall spacers 31. The diffusion starting position of the impurity is away from the region below the end of the gate electrode 26 so that diffusion of the impurity does not extend from the source region to the drain region and there occurs no problem in impurity diffusion.

A manufacturing method of the MISFET Q3 according to Embodiment 3 is substantially similar to that of Embodiment 1. Difference resides in that the MISFET Q3 is manufactured by forming the extension region of the source region and the extension region of the drain region only in the strained silicon layer while preventing them from reaching the silicon-germanium layer below the strained silicon layer.

Embodiment 4

In Embodiments 1 to 3, ordinary MISFETs were described. In Embodiment 4, on the other hand, an LDMISFET will be described. The LDMISFET according to Embodiment 4 is used for, for example, power amplifier circuits 2A and 2B illustrated in FIG. 3.

Figure 21:
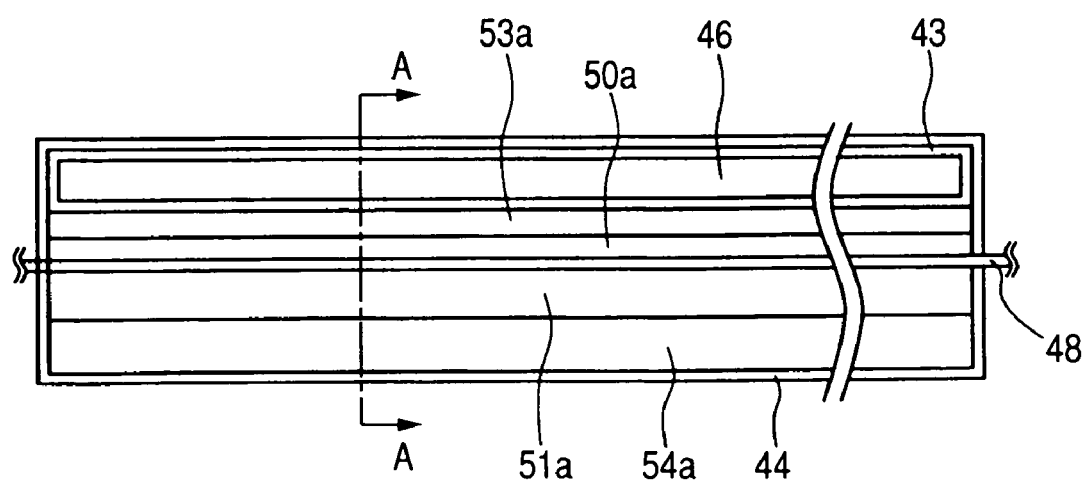
FIG. 21 is a plan view illustrating the schematic constitution of a semiconductor device according to Embodiment 4.

FIG. 21 is a schematic plan view illustrating an LDMISFET Q4 of Embodiment 4. In FIG. 21, a gate electrode 48 extends over a region encompassed by an element isolation region 44. On the side of this gate electrode 48, an $n^+$ type strained silicon layer 50a or an $n^-$ type strained silicon layer 51a is formed. An $n^+$ type strained silicon layer 53a is formed outside the $n^+$ type strained silicon layer 50a, while an $n^+$ type strained silicon layer 54a is formed outside the $n^-$ type strained silicon layer 51a. A p type strained silicon layer 43 is formed outside the $n^+$ type strained silicon layer 53a, while a $p^+$ type polysilicon film 46 is formed inside the p type strained silicon layer 43. From FIG. 21, a wiring layer, sidewall spacers formed over the side walls of the gate electrode 48 and a silicon oxide film formed over the gate electrode 48 are omitted.

Figure 22:
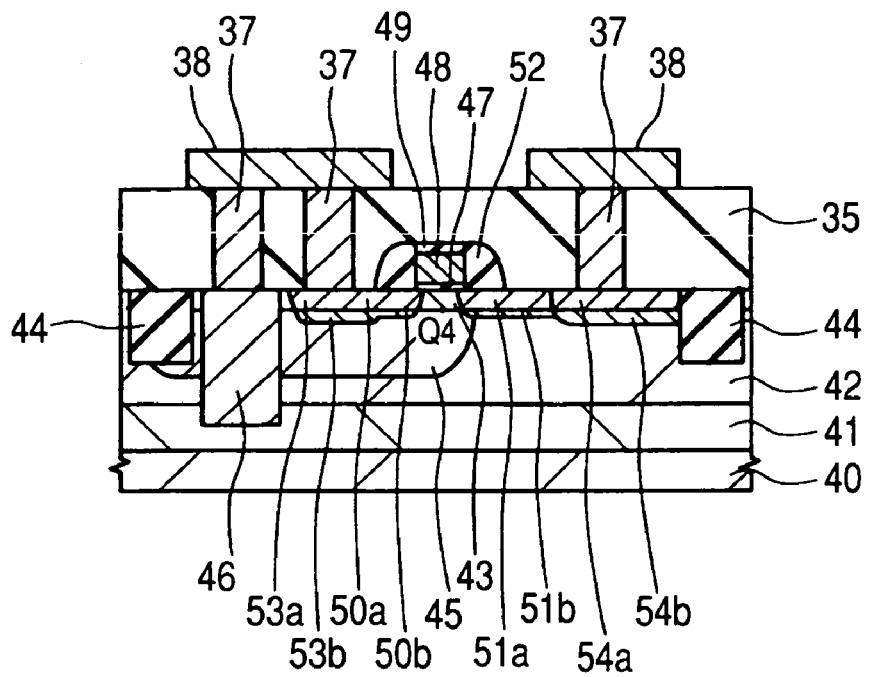
FIG. 22 is a cross-sectional view taken along a line A-A of FIG. 21.
Figure 23:
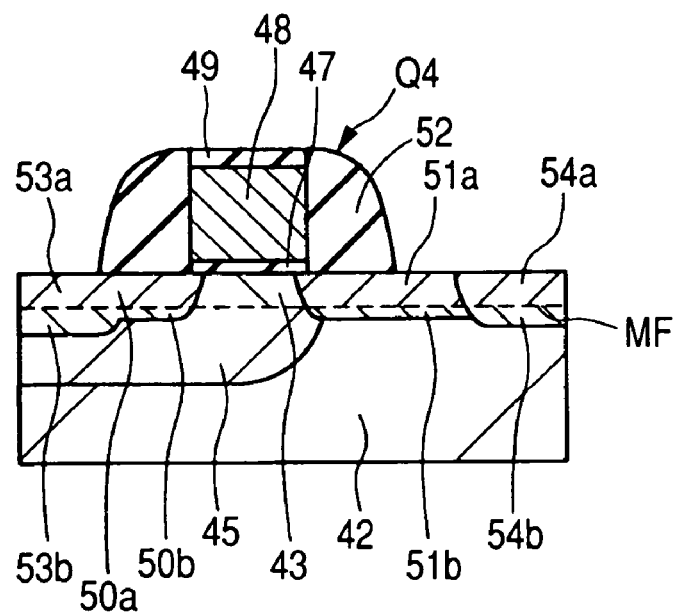
FIG. 23 is a partially enlarged cross-sectional view of FIG. 22.

FIG. 22 is a cross-sectional view taken along a line A-A of FIG. 21 and FIG. 23 is a partially enlarged cross-sectional view of the LDMISFET Q4 of FIG. 22. In FIG. 22, a $p^+$ type silicon-germanium layer 41 is formed over a $p^+$ type semiconductor substrate 40 obtained by introducing a p type impurity (such as boron) into silicon at a high concentration. A $p^-$ type silicon-germanium layer 42 is formed over this $p^+$ type silicon-germanium layer 41.

A p type silicon layer is formed over the $p^-$ type silicon-germanium layer 42. This p type silicon layer and the $p^-$ type silicon-germanium layer 42 are different in lattice constant so that the p type silicon layer is strained and becomes a p type strained silicon layer 43.

A p type silicon-germanium layer 45 is formed in the $p^-$ type silicon-germanium layer 42. This p type silicon-germanium layer 45 and p type strained silicon layer 43 constitute a p well.

In the $p^+$ type silicon-germanium layer 41, a ratio of germanium is changed stepwise from 0% to 15% to positively generate crystal defects in this region. By this, the strain of the $p^+$ type silicon-germanium layer 41 due to a difference in lattice constant from silicon is relaxed. In the $p^-$ type silicon-germanium layer 42 and p type silicon-germanium layer 45, a ratio of germanium is fixed to 15% so that the strain is almost completely relaxed and crystal defects scarcely exist.

In FIG. 23, the thickness of the p type strained silicon layer 43 is about 70 nm. The ratio (concentration) of germanium in the $p^-$ type silicon-germanium layer 42 and p type silicon-germanium layer 45 is 15%. As is apparent from FIG. 1, when the ratio of germanium is 15%, the critical film thickness at which misfit dislocations MF occur on the interface between the p type strained silicon layer 43 and p type silicon-germanium layer 45 (or $p^-$ type silicon-germanium layer 42) is about 25 nm. In this case, the p type strained silicon layer 43 has a thickness of about 70 nm and exceeds the critical film thickness at which misfit dislocations MF occur so that as illustrated in FIG. 23, misfit dislocations MF appear in the vicinity of the interface between the p type strained silicon layer 43 and p type silicon-germanium layer 45 (or $p^-$ type silicon-germanium layer 42).

In FIG. 22, in an active region of the p type strained silicon layer 43, that is, in a region isolated by the element isolation regions 44, the LDMISFET Q4 of Embodiment 4 is formed. This LDMISFET Q4 has a gate insulating film 47 formed over the p type strained silicon layer 43 and a gate electrode 48 formed over the gate insulating film 47. The gate insulating film 47 is made of, for example, a silicon oxide film. The gate electrode 48 is made of, for example, a polysilicon film. A silicon oxide film 49 is formed over the gate electrode 48 as a cap insulating film.

Sidewall spacers 52 are formed over the side walls of the gate electrode 48. These sidewall spacers 52 are made of, for example, a silicon oxide film. An $n^+$ type strained silicon layer 50a and an $n^+$ type silicon-germanium layer 50b are formed below one of the sidewall spacers 52, while an $n^-$ type strained silicon layer 51a and an $n^-$ type silicon-germanium layer 51b are formed below the other sidewall spacer 52. An n type impurity such as phosphorus (P) has been introduced into the $n^+$ type strained silicon layer 50a and $n^+$ type silicon-germanium layer 50b and by these $n^+$ type strained silicon layer 50a and an $n^+$ type silicon-germanium layer 50b, an extension region, which is a portion of the source region, is formed. By the $n^-$ type strained silicon layer 51a and $n^-$ type silicon-germanium layer 51b, a drain offset region is formed.

An n type impurity has been introduced into this drain offset region at a relatively low concentration. This drain offset region is in contact with the p well, which is formed by the p type silicon-germanium layer 45 and p type strained silicon layer 43, in a small region below the end of the gate electrode 48. It is possible to improve the breakdown voltage by disposing such a drain offset region.

An n$^+$ type strained silicon layer 53a and an n$^+$ type silicon-germanium layer 53b are formed outside the extension region made of the n$^+$ type strained silicon layer 50a and an n$^+$ type silicon-germanium layer 50b. By the n$^+$ type strained silicon layer 53a and n$^+$ type silicon-germanium layer 53b, an impurity diffusion region which will be a portion of the source region is formed. In other words, the source region is composed of the extension region and impurity diffusion region. The extension region of the source region is shallower than the impurity diffusion region formed outside the extension region.

The drain region composed of an n$^+$ type strained silicon layer 54a and an n$^+$ type silicon-germanium layer 54b are formed outside the drain offset region composed of the n$^-$ type strained silicon layer 51a and n$^-$ type silicon-germanium layer 51b.

An insulating film 35 which will be an interlayer insulating film is formed over the LDMISFET Q4 having such a constitution. This insulating film 35 has a contact hole 36 formed therein. A plug 37 is formed by filling a conductive material such as tungsten in the contact hole 36. The plug 37 is composed of a barrier film made of, for example, a titanium film or titanium nitride film, and a tungsten film. An interconnect 38 electrically connected to the plug 37 is formed over the plug 37. The interconnect 38 is made of, for example, an aluminum film. A trench extending from the p type strained silicon layer 43 to the p$^+$ type silicon-germanium layer 41 is formed on the side of the LDMISFET Q4 in order to electrically connect the source region of the LDMISFET Q4 to the p$^+$ type semiconductor substrate 40. A p$^+$ type polysilicon film 46 is buried in this trench.

In Embodiment 4, similar to Embodiment 1, the strained silicon layer has a thickness exceeding the critical film thickness and a similar effect to Embodiment 1 is therefore available. As illustrated in FIG. 23, since the strained silicon layer of the LDMISFET Q4 in Embodiment 4 has a thickness exceeding the critical film thickness, misfit dislocations MF exist in the vicinity of the interface between the strained silicon layer and silicon-germanium layer. The misfit dislocations MF themselves are electrically inactive and do not increase a leak current. There is however a fear that the misfit dislocations MF may become a path for impurity diffusion and a leak current may be caused by the impurity diffusion. The leak current (reduction in breakdown voltage) caused by impurity diffusion depends on the impurity concentration of the source and drain regions below the end of the gate electrode 48 at a position where the misfit dislocations MF exist.

The relationship between the breakdown voltage and the impurity concentration of the extension region (a portion of the source region) below the end of the gate electrode 48 at a position where the misfit dislocations MF occur (interface between the strained silicon layer and silicon-germanium layer) was investigated.

Figure 24:
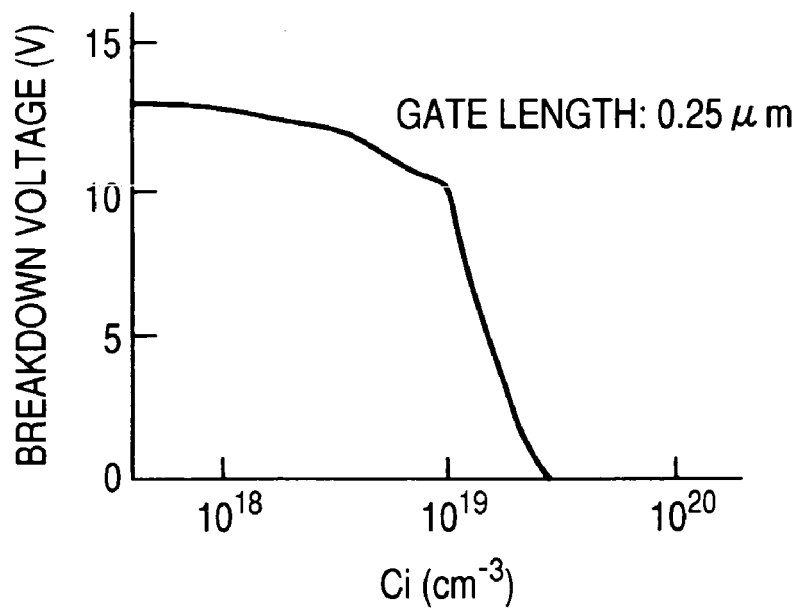
FIG. 24 is a graph illustrating the relationship between an impurity concentration and breakdown voltage.

FIG. 24 is a graph showing the relationship between the breakdown voltage and the impurity concentration of the extension region (a portion of the source region) below the end of the gate electrode 48 at a position where the misfit dislocations MF occur. In FIG. 24, the impurity concentration (cm$^{-3}$) is plotted along the abscissa, while the breakdown voltage (V) is plotted along the ordinate. The test was performed with the LDMISFET Q4 having a gate length of 0.25 µm as an example. This LDMISFET Q4 was formed after subjected to only essential heat treatment steps.

As is apparent from FIG. 24, with an increase in the impurity concentration, the breakdown voltage lowers. In particular, at an impurity concentration of $1 \times 10^{19}$ cm$^{-3}$ or greater, the breakdown voltage shows a drastic decrease. This is because the diffusion length of the impurity by the heat treatment becomes longer when the impurity concentration is higher. It is only necessary to adjust the impurity concentration of the extension region below the gate electrode 48 at a position where the misfit dislocations MF occur to $1 \times 10^{19}$ cm$^{-3}$ or less in order to suppress leakage or a reduction in the breakdown voltage to the allowable limit. For example, the impurity concentration of the extension region usually lowers as the depth from the surface becomes greater. The above-described condition can be satisfied if the thickness of the strained silicon layer is set at least a predetermined value. Incidentally, it is also necessary to adjust the impurity concentration of the drain offset region below the gate electrode 48 at a position where the misfit dislocations MF occur to $1 \times 10^{19}$ cm$^{-3}$ or less. It is needless to say that the impurity concentration in the drain offset region satisfies the above-described condition because it is low without any adjustment.

In Embodiment 4, the whole drain offset region (combined region of the n$^-$ type strained silicon layer 51a and n$^-$ type silicon-germanium layer 51b) has a thickness of about 100 nm, while the n$^-$ type strained silicon layer has a thickness of about 70 nm. More than half of the drain offset region can be formed in the n$^-$ type strained silicon layer 51a having a high electron mobility so that the drain offset region is able to have a reduced sheet resistance. It is also possible to form the whole drain offset region in the strained silicon layer.

Figure 25:
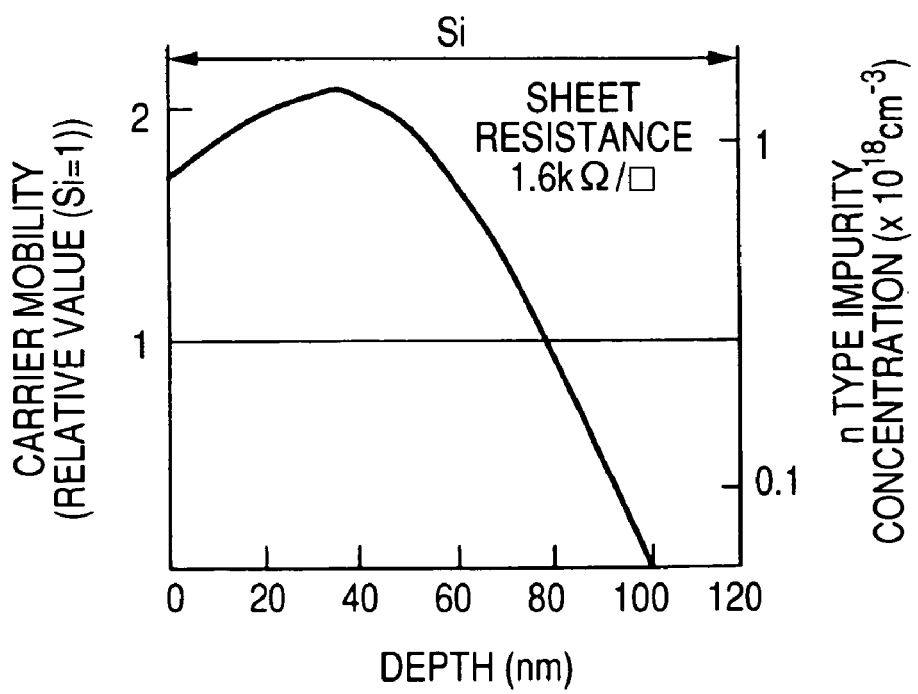
FIG. 25 is a graph illustrating the relationship between a depth from the surface of a semiconductor substrate and the concentration of an n type impurity or carrier mobility when an ordinary silicon layer is used.
Figure 26:
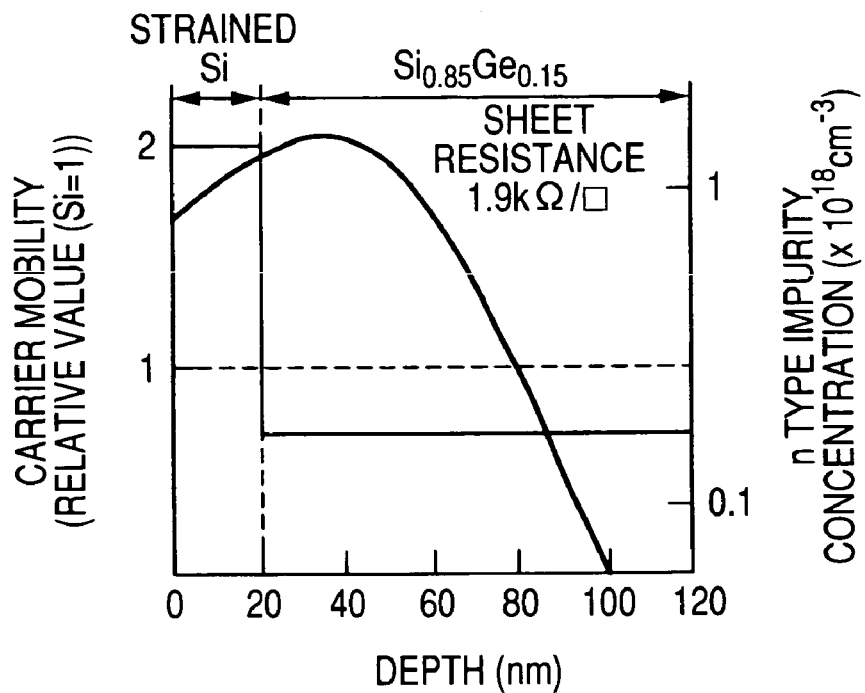
FIG. 26 is a graph illustrating the relationship between a depth from the surface of a semiconductor substrate and the concentration of an n type impurity or carrier mobility when a strained silicon layer having not greater than the critical film thickness is used.
Figure 27:
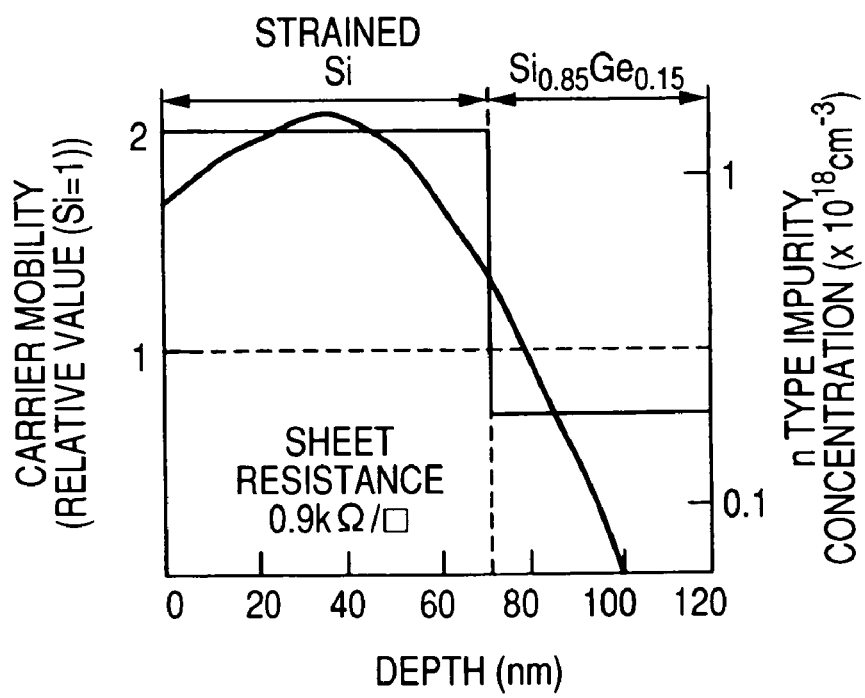
FIG. 27 is a graph illustrating the relationship between a depth from the surface of a semiconductor substrate and the concentration of an n type impurity or carrier mobility when a strained silicon layer having at least the critical film thickness is used.

How much the sheet resistance can be reduced in Embodiment 4 will next be described specifically. FIG. 25 illustrates an impurity profile and electron mobility when a drain offset region is formed in a strain-free ordinary silicon layer, while FIG. 26 illustrates an impurity profile and electron mobility when the drain offset region is formed in a silicon-germanium layer and a strained silicon layer of about 20 nm thick (not greater than the critical film thickness) formed over the silicon-germanium layer. FIG. 27 illustrates an impurity profile and electron mobility in Embodiment 4 when the drain offset region is formed in a silicon-germanium layer and a strained silicon layer of about 70 nm thick (greater than the critical film thickness) formed over the silicon-germanium layer.

In FIGS. 25, 26 and 27, the depth from the surface is plotted along the abscissa and its unit is nm. An electron mobility relative to that of the ordinary silicon layer set at 1 is plotted along the left one of two ordinates and an n type impurity concentration in the drain offset region is plotted along the right one of two ordinates.

In FIG. 25, the drain offset region is formed in a strain-free silicon layer so that the electron mobility in the offset region is 1. The n type impurity concentration in the drain offset region gradually increases as the depth becomes greater from 0 nm and the n type impurity concentration at a depth of about 40 nm exceeds $1.0 \times 10^{18}$ cm$^{-3}$ and reaches a peak. When the depth becomes greater than about 40 nm, the n type impurity concentration lowers and it drops to below $0.1 \times 10^{18}$ cm$^{-3}$ at the depth of about 100 nm. This means that the drain offset region extends to the depth near about 100 nm. The sheet resistance of the offset region is proportional to the inverse of an integration value of (n type impurity concentration×electron mobility) in the depth direction. The sheet resistance becomes 1.6 kΩ/□ as a result of calculation based on the above equation.

In FIG. 26, the impurity profile of the drain offset region is similar to that illustrated in FIG. 25 and the drain offset region extends to the depth of about 100 nm. In this drain offset region, a strained silicon layer is formed from the depth of 0 nm to the depth of about 20 nm so that the electron mobility up to this depth is about 2, while the electron mobility at the depth of 20 nm or greater is smaller than that of the ordinary silicon layer, that is, smaller than 1 because the silicon-germanium layer is formed at the depth greater than 20 nm. The peak of the n type impurity concentration exists near the depth of about 40 nm, meaning that more than half of the n type impurity exists in the silicon-germanium layer. The sheet resistance as calculated based on the above-described equation becomes 1.9 k$\Omega$/□. Even if a strained silicon layer of about 20 nm thick is formed over the silicon-germanium layer, this does not bring about an improvement in electron mobility of the whole drain offset region because more than half of the drain offset region is formed in the silicon-germanium layer.

In FIG. 27, the impurity profile of the drain offset region is similar to that illustrated in FIG. 25 of 26 and the drain offset region has a depth of about 100 nm. In Embodiment 4, a strained silicon layer occupies a region from the depth of 0 nm to the depth of 70 nm so that electron mobility up to this depth is about 2. A region deeper than 70 nm is occupied by a silicon-germanium layer so that at the depth of 70 nm or greater, the electron mobility becomes smaller than 1. The n type impurity concentration has a peak at the depth of about 40 nm so that this peak exists within the strained silicon layer. As is apparent from FIG. 27, the strained silicon layer is formed from the depth of 0 nm to the depth of 70 nm of the drain offset region so that more than half (at least about 80%) of an n type impurity exists in the strained silicon layer having high electron mobility. This suggests a reduction in the sheet resistance. As a result of calculation based on the above-described equation, the sheet resistance becomes 0.9 k$\Omega$/□. This Embodiment makes it possible to reduce the sheet resistance compared with those shown in FIGS. 25 and 26 because more than half of the drain offset region can be formed in the strained silicon layer. More specifically, the sheet resistance can be reduced to about 70% of that shown in FIG. 25 and about 50% of that shown in FIG. 26.

In the below-described specific examples, more than half of the drain offset region is formed in the strained silicon layer. For example, as illustrated in FIG. 27, the strained silicon layer has a depth of about 70 nm and the peak of the impurity concentration exists at the depth of about 40 nm. In the impurity profile of the drain offset region, when the peak of the impurity concentration exists in the strained silicon layer, it can be regarded as one example where more than half of the offset region is in the strained silicon layer.

In Embodiment 4, as illustrated in FIG. 27, at least about 80% of the impurity exists in the strained silicon layer. It is therefore preferred that at least about 80% of the impurity exists in the strained silicon layer. Existence of the peak of the impurity concentration in the strained silicon layer is however given above as one example where more than half of the drain offset region is formed in the strained silicon layer. Existence of the peak of the impurity concentration in the strained layer is, in other words, existence of at least half of the impurity in the strained silicon layer, when the fact that the impurity concentration graph is almost symmetric with its peak at the center thereof is taken into consideration. Accordingly, when at least ½ of the impurity in the offset region exists in the strained layer, it can be regarded as one example where more than half of the offset region is formed in the strained silicon layer.

In Embodiment 4, as illustrated in FIG. 27, the drain offset region has a thickness of about 100 nm, while the strained silicon layer has a thickness of about 70 nm. So, when the position (50 nm deep) which is half of the thickness of the drain offset region exists in the strained silicon layer, it can be regarded as one example where more than half of the offset region is formed in the strained silicon layer.

According to the LDMISFET Q4 in Embodiment 4, the channel region can be formed in the p type strained silicon layer 43 and at the same time, more than half of the drain offset region can be formed in the n⁻ type strained silicon layer 51a as illustrated in FIGS. 22 and 23. This makes it possible to reduce the resistance of the channel region and drain offset region and therefore, to reduce the on resistance of the LDMISFET Q4.

The power added efficiency of a power amplifier composed of the LDMISFET Q4 is proportional to $1-R_{ON}/(Vdd \times Id)$, wherein $R_{ON}$ means on resistance, Vdd means drain voltage and Id means drain current. Accordingly, the power added efficiency of the power amplifier can be raised by decreasing the on resistance. For example, compared with an LDMISFET using an ordinary silicon, the efficiency of a GSM power amplifier, which is a typical example of a nonlinear system, using the LDMISFET Q4 increases by about 2 points and the efficiency of a WCDMA power amplifier, which is a typical example of a linear system, using the LDMISFET Q4 increases by about 5 points.

A manufacturing method of the LDMISFET Q4 according to Embodiment 4 will next be described based on some drawings.

Figure 28:
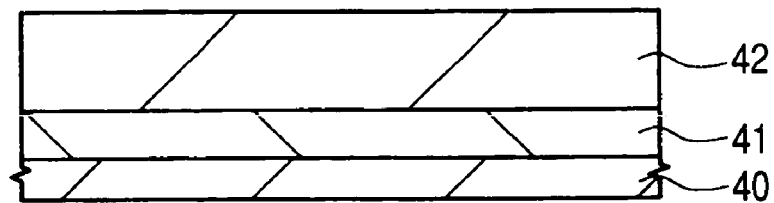
FIG. 28 is a cross-sectional view illustrating a manufacturing step of a semiconductor device according to Embodiment 4.

A p⁺ type semiconductor substrate 40 as illustrated in FIG. 28 is prepared by introducing a p type impurity (such as boron) into silicon at a high concentration. A p⁺ type silicon-germanium layer 41 is formed over this p⁺ type semiconductor substrate 40. The p⁺ type silicon-germanium layer 41 can be formed, for example, by using CVD (Chemical Vapor Deposition). This p⁺ type silicon-germanium layer 41 is obtained by causing the growth of a layer to about 1 µm while increasing stepwise the ratio of germanium from 0% to 15%. Then, p⁻ type silicon-germanium layer 42 of about 2 µm is caused to grow over the p⁺ type silicon-germanium layer 41 while keeping the ratio of germanium at 15%.

Figure 29:
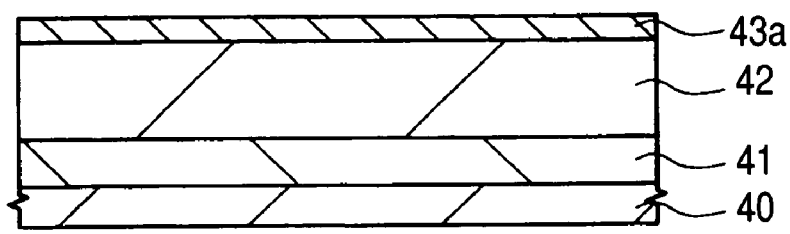
FIG. 29 is a cross-sectional view illustrating a manufacturing step of the semiconductor device following that of FIG. 28.

As illustrated in FIG. 29, a p⁻ type silicon layer is then formed over the p⁻ type silicon-germanium layer 42. This p⁻ type silicon layer is formed using, for example, epitaxial growth and it has, for example, a thickness of about 85 nm. This p type silicon layer becomes a p⁻ type strained silicon layer 43a. The germanium concentration of the p⁻ type silicon-germanium layer 42 is 15% and the critical film thickness at which no misfit dislocation occurs is, as is apparent from FIG. 1, about 25 nm. In this case, the p⁻ type strained silicon layer 43a formed over the p⁻ type silicon-germanium layer 42 has a thickness of about 85 nm which exceeds the critical film thickness. Misfit dislocations therefore appear in the vicinity of the interface between the p⁻ type silicon-germanium layer 42 and the p⁻ type strained silicon layer 43a.

Figure 30:
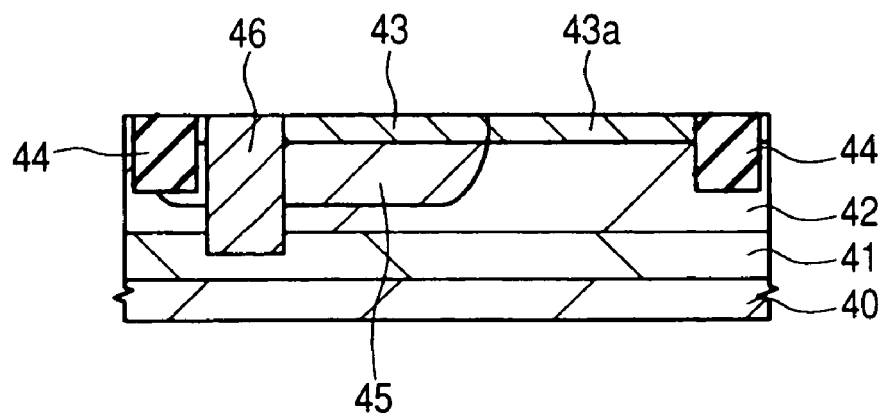
FIG. 30 is a cross-sectional view illustrating a manufacturing step of the semiconductor device following that of FIG. 29.
Figure 31:
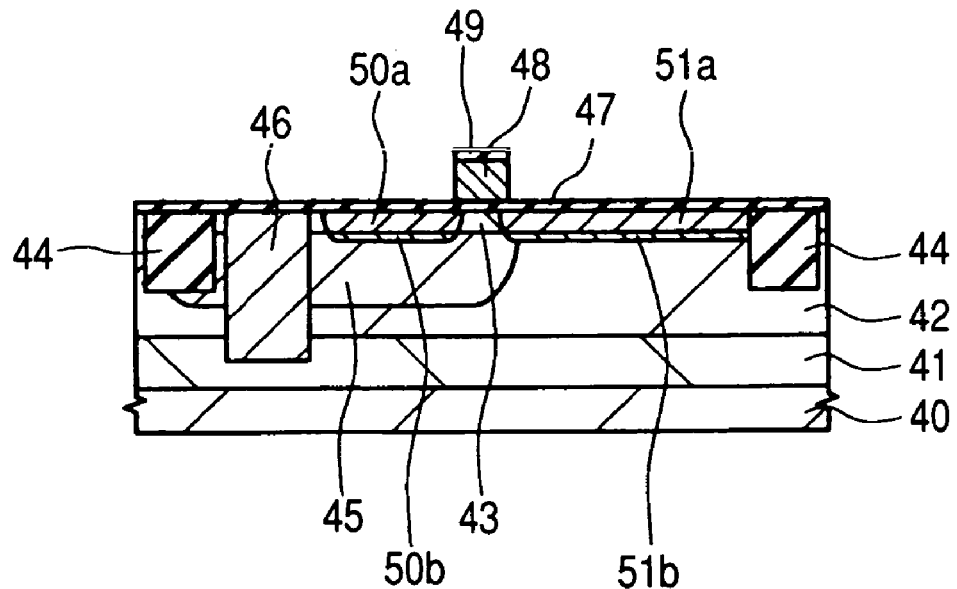
FIG. 31 is a cross-sectional view illustrating a manufacturing step of the semiconductor device following that of FIG. 30.

Boron (B) is then introduced into the p⁻ type silicon-germanium layer 42 and the p⁻ type strained silicon layer 43a by using photolithography and ion implantation, followed by heat treatment, whereby a p type silicon-germanium layer 45 and a p type strained silicon layer 43 are formed as illustrated in FIG. 30.

A trench extending from the surface of the p⁻ type strained silicon layer 43a to the p⁺ type silicon-germanium layer 41 is formed using photolithography and etching. A p⁺ type polysilicon film 46 is formed, for example, by CVD to fill this trench. Then, an unnecessary portion of the p⁺ type polysilicon film 46 is removed using, for example, CMP to leave the p+ type polysilicon film 46 only in the trench. This p+ type polysilicon film 46 has a role of electrically connecting the source region which will be described later and the p+ type semiconductor substrate 40.

After an element isolation trench is formed using photolithography and etching, a silicon oxide film is formed over the p+ type semiconductor substrate 40 so as to fill it in this element isolation trench. The silicon oxide film thus formed is then polished by CMP (Chemical Mechanical Polishing) to form an element isolation region 44.

A gate insulating film 47 made of, for example, a silicon oxide film is then formed over the main surface of the p+ type semiconductor substrate 40 by making use of thermal oxidation. A polysilicon film is the formed over the gate insulating film 47, followed by the formation of a silicon oxide film 49 over this polysilicon film. The polysilicon film and silicon oxide film 49 can be formed using, for example, CVD.

The polysilicon film and silicon oxide film 49 are patterned by making use of photolithography and etching. By this patterning, a gate electrode 48 made of the polysilicon film can be formed.

An n type impurity such as phosphorus is introduced into the p type strained silicon layer 43 and p type silicon-germanium layer 45 by making use of photolithography and ion implantation, followed by heat treatment to form an n+ type strained silicon layers 50a and n+ type silicon-germanium layers 50b in alignment with the gate electrode 48. Here, an extension region of the source region is formed by the n+ type strained silicon layer 50a and n+ type silicon-germanium layer 50b.

An n type impurity such as phosphorus is introduced into the p− type strained silicon layer 43a and p− type silicon-germanium layer 42 by making use of photolithography and ion implantation, followed by heat treatment to form an n− type strained silicon layers 51a and n− type silicon-germanium layers 51b in alignment with the gate electrode 48. Here, a drain offset region is formed by the n− type strained silicon layer 51a and n− type silicon-germanium layer 51b.

At this time, the thickness of the strained silicon layers (including p type strained silicon layer 43, n+ type strained silicon layer 50a, and n− type strained silicon layer 51a) decrease from about 85 nm to about 70 nm as a result of etching by washing in each step or consumption for the formation of the gate insulating film 47. Even if the thickness of the strained silicon layers is reduced to about 70 nm, it exceeds the critical film thickness, that is, about 25 nm (about 15 nm when etching by washing in each step or consumption during formation of the gate insulating film 47 is taken into consideration). In short, the strained silicon layer is thicker than the conventional one.

Figure 32:
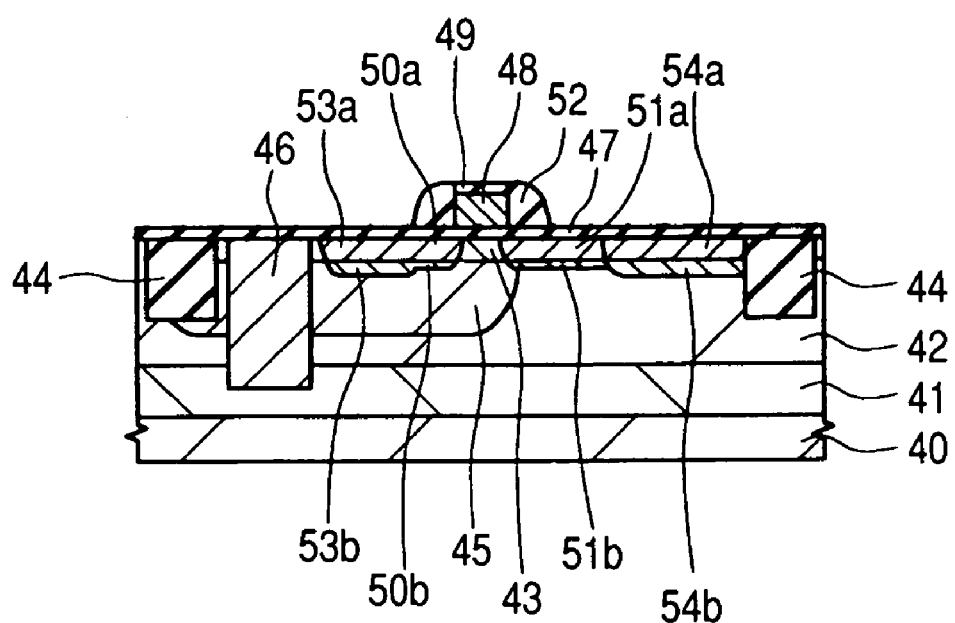
FIG. 32 is a cross-sectional view illustrating a manufacturing step of the semiconductor device following that of FIG. 31.

A silicon oxide film, for example, is then formed over the main surface of the p+ type semiconductor substrate 40. This silicon oxide film can be formed using, for example, CVD. By anisotropic etching of this silicon oxide film, sidewall spacers 52 are formed over the side walls of the gate electrode 48, as illustrated in FIG. 32.

An n type impurity such as phosphorus is then introduced by making use of photolithography and ion implantation, followed by heat treatment, whereby n+ type strained silicon layers 53a and 54a and n+ type silicon-germanium layers 53b and 54b are formed. Here, a portion (impurity diffusion region) of the source region is formed by the n+ type strained silicon layer 53a and n+ type silicon-germanium layer 53b, while a drain region is formed by the n+ type strained silicon layer 54a and n+ type silicon-germanium layer 54b.

As illustrated in FIG. 22, an interlayer insulating film 35 made of, for example, a silicon oxide film is formed over the p+ type semiconductor substrate 40. This interlayer insulating film 35 can be formed, for example, by CVD. A contact hole 36 reaching each of the source and drain regions and the p+ type polysilicon film 46 is formed in the interlayer insulating film 35 by using photolithography and etching.

After formation of a titanium/titanium nitride film (not illustrated) over the interlayer insulating film 35 having the contact hole 36 formed therein, a tungsten film is formed over this titanium/titanium nitride film. The titanium/titanium nitride film can be formed, for example, by sputtering, while the tungsten film can be formed, for example, by CVD.

The titanium/titanium nitride film and tungsten film are left only in the contact hole 36 by removing an unnecessary portion of the titanium/titanium nitride film and tungsten film from the interlayer insulating film 35 by CMP, whereby a plug 37 can be formed. Over the interlayer insulating film 35 formed the plug 37 therein, an aluminum film is formed. The aluminum film can be formed by using, for example, sputtering. The aluminum film is then patterned using photolithography and etching, whereby an interconnect 38 is formed.

In such a manner, the LDMISFET Q4 of Embodiment 4 can be formed.

Embodiment 5

In Embodiment 4, an example in which the source region extends over both the strained silicon layer and silicon-germanium layer therebelow was described. In Embodiment 5, an example in which a source region is formed only in a strained silicon layer will be described. Incidentally, a plain view of LDMISFET Q5 according to Embodiment 5 is similar to that of FIG. 21.

Figure 33:
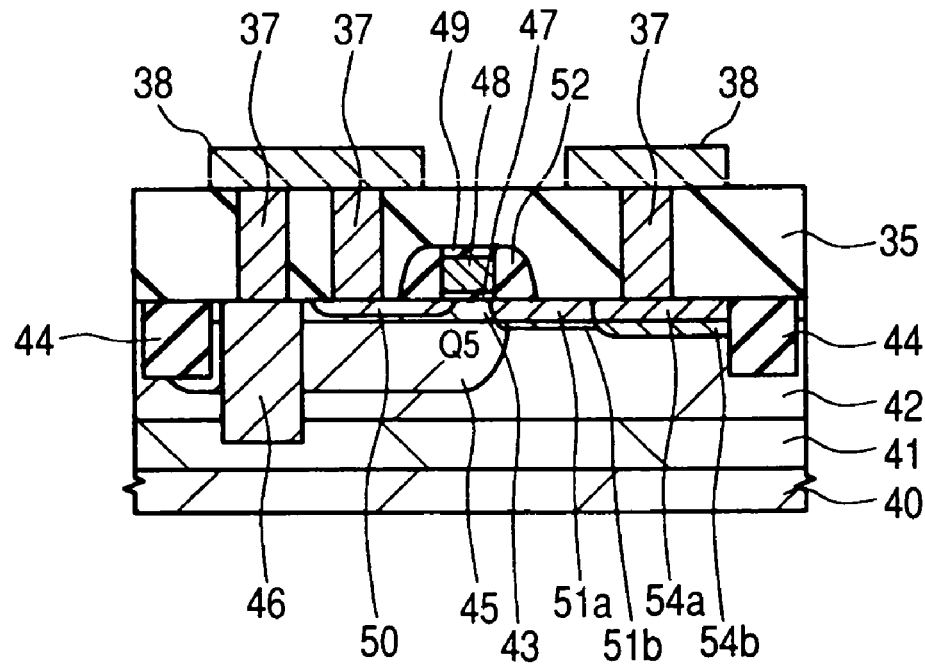
FIG. 33 is a cross-sectional view illustrating a semiconductor device according to Embodiment 5.
Figure 34:
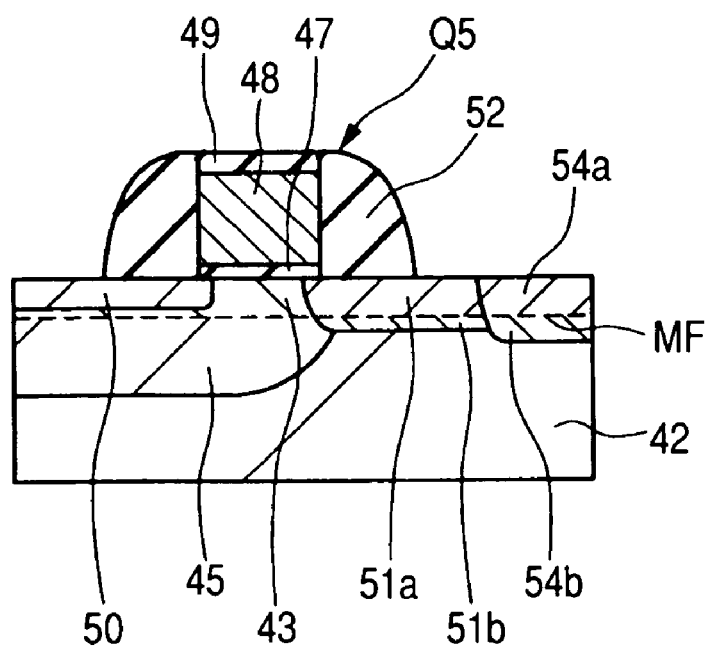
FIG. 34 is a partially enlarged cross-sectional view of FIG. 33.

FIG. 33 is a cross-sectional view illustrating the LDMISFET Q5 according to Embodiment 5; and FIG. 34 is a partially enlarged cross-sectional view of the LDMISFET Q5 of FIG. 33. In FIGS. 33 and 34, the LDMISFET Q5 according to Embodiment 5 has almost a similar constitution to that of the LDMISFET Q4 of Embodiment 4 so that only a difference between them will next be described. A difference between Embodiment 4 and Embodiment 5 resides in that the source region is composed alone of an n+ type strained silicon layer 50. In the LDMISFET Q5 according to Embodiment 5, the source region is formed only in a strained silicon layer (p type strained silicon layer 43) and is not formed in a silicon-germanium layer (p type silicon-germanium layer 45) formed below the strained silicon layer.

In Embodiment 5, the strained silicon layer (p type strained silicon layer 43) has a thickness of about 70 nm, which exceeds the critical film thickness at which no misfit dislocations MF occurs. Accordingly, misfit dislocations MF occur on the interface between the strained silicon layer (p type strained silicon layer 43) and silicon-germanium layer (p type silicon-germanium layer 45).

The source region has a thickness of about 40 nm, which is shallower than the interface between the strained silicon layer (p type strained silicon layer 43) and silicon-germanium layer (p type silicon-germanium layer 45). The source region is however thicker than about 15 nm (a value when etching by washing in each step or consumption during formation of the gate insulating film 25 is taken into consideration), that is, the critical film thickness in the related art at which no misfit dislocation MF occurs. A similar effect to that described in Embodiment 4 is therefore available in Embodiment 5.

In Embodiment 5, the drain offset region has a thickness of about 100 nm, thicker than 70 nm, which is a thickness of the strained silicon layer (p type strained silicon layer 43). It is also possible to decrease the thickness of the drain offset region to not greater than 70 nm and form the whole drain offset region in the strained silicon layer.

According to Embodiment 5, the source region ($n^+$ type strained silicon layer 50) is distant from the misfit dislocations MF as illustrated in FIG. 34 so that it is free from the influence of abnormal diffusion of the impurity via the misfit dislocations. This brings about an effect of actualizing a minute LDMISFET with a small gate width.

A manufacturing method of the LDMISFET Q5 of Embodiment 5 is almost similar to that of Embodiment 4 except that the source region is formed only in the strained silicon layer and it does not extend to the silicon-germanium layer below the strained silicon layer.

Embodiment 6

In Embodiment 4, an example in which the source region was formed in both the strained silicon layer and silicon-germanium layer therebelow was described. In Embodiment 6, on the other hand, an example in which an extension region of a source region is formed only in a strained silicon layer will be described. Incidentally, a plain view of an LDMISFET Q6 according to Embodiment 6 is similar to that of FIG. 21.

Figure 35:
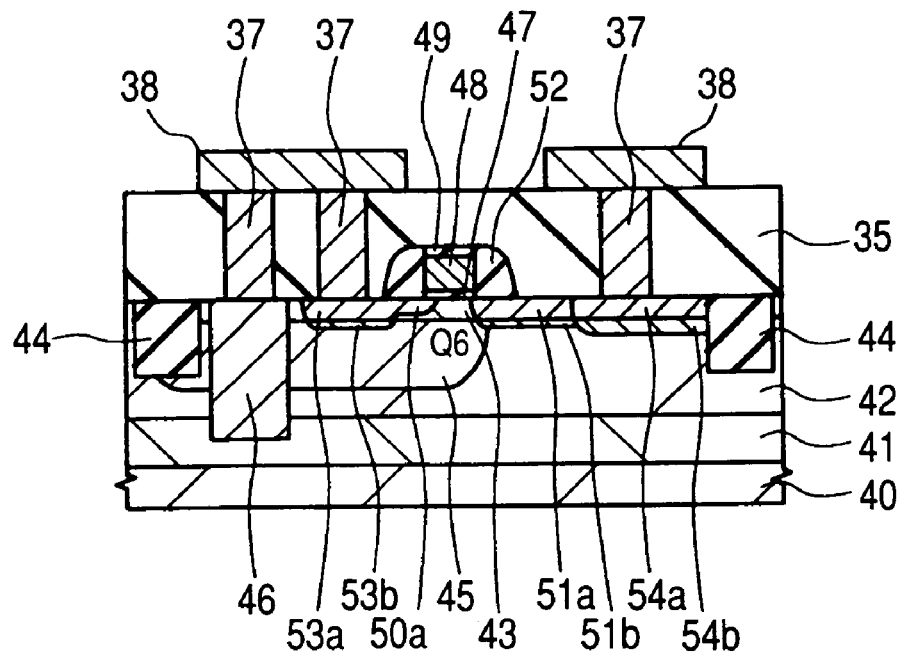
FIG. 35 is a cross-sectional view illustrating a semiconductor device according to Embodiment 6.
Figure 36:
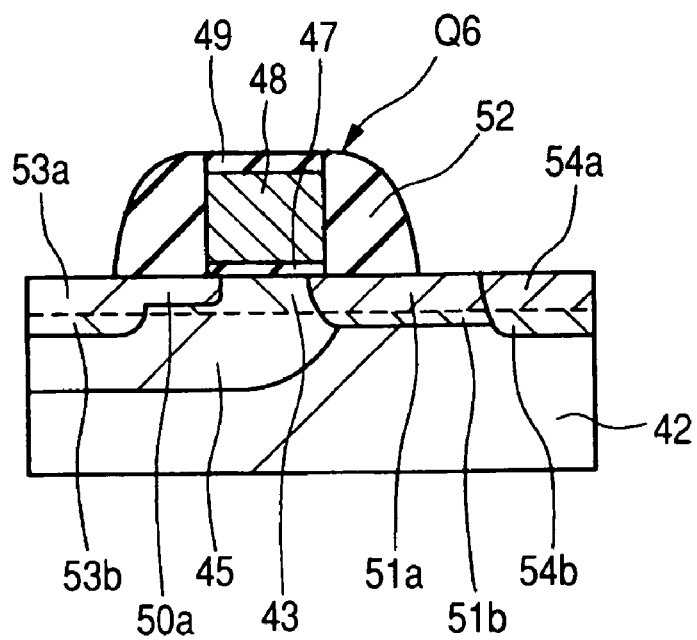
FIG. 36 is a partially enlarged cross-sectional view of FIG. 35.

FIG. 35 is a cross-sectional view illustrating the LDMISFET Q6 according to Embodiment 6; and FIG. 36 is an enlarged cross-sectional view of the LDMISFET Q6 of FIG. 35. In FIGS. 35 and 36, the LDMISFET Q6 has almost a similar constitution to that of the LDMISFET Q4 of Embodiment 4 so that only a difference between them will next be described. A difference between Embodiment 4 and Embodiment 6 resides in that an extension region of a source region is composed alone of an $n^+$ type strained silicon layer 50a. In short, the extension region is formed only in a strained silicon layer.

The p type strained silicon layer 43 has a thickness of 70 nm, thicker than the critical film thickness so that it exceeds the critical film thickness at which no misfit dislocation MF occurs. Accordingly, as illustrated in FIG. 36, misfit dislocations MF occur on the interface between the strained silicon layer and the silicon-germanium layer.

The $n^+$ type strained silicon layer 50a formed in this p type strained silicon layer 43 has a thickness of about 40 nm. The extension region ($n^+$ type strained silicon layer 50a) of the source region is shallower than the interface between the strained silicon layer and the silicon-germanium layer. The source region (impurity diffusion region) other than the extension region is made of an $n^+$ type strained silicon layer 53a and an $n^+$ type silicon-germanium layer 53b so that it is deeper than the interface between the strained silicon layer and silicon-germanium layer.

In Embodiment 6, the drain offset region has a thickness of about 100 nm, thicker than 70 nm, which is a thickness of the strained silicon layer (p type strained silicon layer 43). It is also possible to adjust the thickness of the drain offset region to 70 nm or less and form the whole drain offset region in the strained silicon layer.

According to Embodiment 6, a similar effect to Embodiment 4 is available. Since the source region other than extension region is deeper the interface of the strained silicon layer and silicon-germanium layer, a parasitic resistance of the source region can be reduced.

A manufacturing method of the LDMISFET Q6 of Embodiment 6 is almost similar to that of Embodiment 4 except that the extension region of the source region is formed only in the strained silicon layer and it does not extend to the silicon-germanium layer below the strained silicon layer.

Embodiment 7

In Embodiments 4 to 6, a formation example of a strained silicon layer over a silicon-germanium layer was described. In Embodiment 7, a formation example of a strained silicon layer over an SOI (Silicon On Insulator) structure will be described. A plain view of an LDMISFET Q7 of Embodiment 7 is similar to that of FIG. 21.

Figure 37:
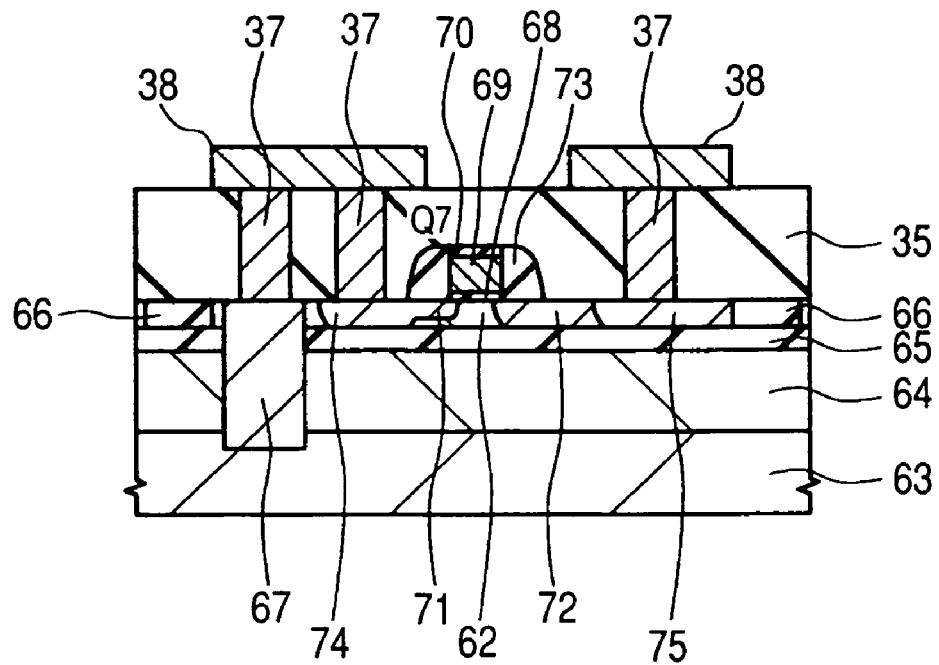
FIG. 37 is a cross-sectional view illustrating a semiconductor device according to Embodiment 7.
Figure 38:
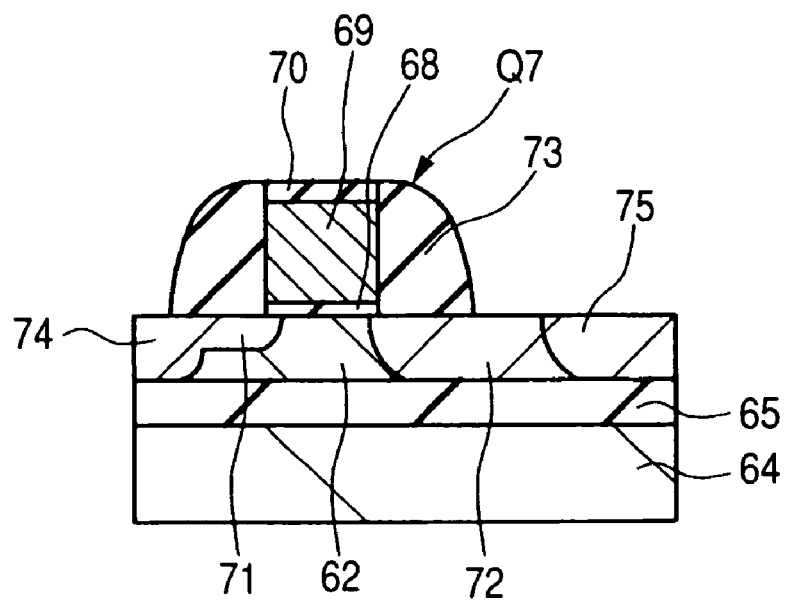
FIG. 38 is a partially enlarged cross-sectional view of FIG. 37.

FIG. 37 is a cross-sectional view illustrating the LDMISFET Q7 of Embodiment 7, while FIG. 38 is a partially enlarged cross-sectional view of the LDMISFET Q7 of FIG. 37. In FIGS. 37 and 38, a $p^-$ type silicon layer 64 is formed over a $p^+$ type semiconductor substrate 63 obtained by introducing a p type impurity (such as boron) into silicon at a high concentration. A silicon oxide film 65 is formed over this $p^-$ type silicon layer 64. The thickness of the $p^-$ type silicon layer 64 is about 2 μm and that of the silicon oxide film is about 100 nm. The SOI structure is formed by the $p^+$ type semiconductor substrate 63, $p^-$ type silicon layer 64 and silicon oxide film 65.

A p type silicon layer is formed over the silicon oxide film 65. This p type silicon layer is a p type strained silicon layer 62 having an equal level of strain to that of a strained silicon layer formed by epitaxial growth over a strain-relaxed silicon-germanium layer (a ratio of germanium is 15%). The p type strained silicon layer 62 has a thickness of about 70 nm.

In FIG. 37, the LDMISFET Q7 of Embodiment 7 is formed in an active region of the p type strained silicon layer 62, that is, a region isolated by an element isolation region 66. This LDMISFET Q7 has a gate insulating film 68 formed over the p type strained silicon layer 62 and a gate electrode 69 formed over the gate insulating film 68. A silicon oxide film 70 which will be a cap insulating film is formed over the gate electrode 69.

Sidewall spacers 73 are formed over the side walls of the gate electrode 69. An $n^+$ type strained silicon layer 71 is formed below one of the sidewall spacers 73, while an $n^-$ type strained silicon layer 72 is formed below the other sidewall spacer 73.

The $n^+$ type strained silicon layer 71 will be an extension region of a source region. This $n^+$ type strained silicon layer 71 has a thickness of about 50 nm, thinner than the p type strained silicon layer 62 (about 70 nm). The thickness of the $n^+$ type strained silicon layer 71 is greater than 15 nm (a value when etching by washing in each step or consumption by the formation of a gate insulating film is taken into consideration), that is, the upper limit of the film thickness at which no misfit dislocation occurs assuming that a strained silicon layer is formed over a silicon-germanium layer.

The $n^-$ type strained silicon layer 72 will be a drain offset region. The $n^-$ type strained silicon layer 72 has a thickness of about 70 nm which is equal to that of the strained silicon layer formed over the SOI structure.

An $n^+$ type strained silicon layer 74 is formed outside the extension region composed of the $n^+$ type strained silicon layer 71. This $n^+$ type strained silicon layer 74 is an impurity diffusion region which will be a portion of the source region. The $n^+$ type strained silicon layer 74 has a depth greater than that of the $n^+$ type strained silicon layer 71. An $n^+$ type strained silicon layer 75 which will be a drain region is formed outside the drain offset region composed of the $n^-$ type strained silicon layer 72.

An insulating film 35 which will be an interlayer insulating film is formed over the LDMISFET Q7 having such a constitution. This insulating film 35 has a contact hole 36 formed therein. A plug 37 is formed by filling a conductive material such as tungsten in the contact hole 36. The plug 37 is composed of a barrier film made of, for example, a titanium film or titanium nitride film, and a tungsten film. An interconnect 38 electrically connected to the plug 37 is formed over the plug 37. This interconnect 38 is made of, for example, an aluminum film. A trench extending from the p type strained silicon layer 62 to the $p^+$ type semiconductor substrate 63 is formed on the side of the LDMISFET Q7 in order to electrically connect the source region of the LDMISFET Q7 to the $p^+$ type semiconductor substrate 63. A $p^+$ type polysilicon film 67 is filled in this trench.

In Embodiment 7, the strained silicon layer has a thickness exceeding the critical film thickness as in Embodiment 4 so that a similar effect to Embodiment 4 is available in this Embodiment 7. In other words, a strained silicon layer is formed over the silicon oxide film 65. This strained silicon layer has a thickness greater than the upper limit of the film thickness at which no misfit dislocation occurs assuming that the strained silicon layer is formed over a silicon-germanium layer. Since the strained silicon layer has a thickness exceeding the critical film thickness, a similar effect to Embodiment 4 is available in Embodiment 7.

As described in Embodiment 4, in an LDMISFET having a strained silicon layer formed over a silicon-germanium layer, it is possible to avoid the problem of a leak current even if the thickness of the strained silicon layer exceeds the critical film thickness at which no misfit dislocation MF occurs. This clearly shows that the problem of a leak current can also be avoided even when an LDMISFET is formed by transferring the strained silicon layer having a thickness exceeding the critical film thickness onto the silicon oxide film.

It is needless to say that in the LDMISFET having, formed over the SOI structure, a strained silicon layer thicker than the critical film thickness, the thickness of the drain offset region can be made greater than the critical thickness in the case where the strained silicon layer is formed over the silicon-germanium layer. The drain offset region is therefore composed of a strained silicon layer having high electron mobility and sufficient thickness, and as a result, the drain offset region is able to have a reduced sheet resistance.

In addition, a silicon-germanium layer having a low thermal conductivity is completely omitted from the LDMISFET Q7 of Embodiment 7 so that compared with an LDMISFET having a strained silicon layer formed over a silicon-germanium layer, the LDMISFET Q7 has improved thermal conductivity and is resistant to deterioration of performances due to self heating.

A manufacturing method of the LDMISFET Q7 of Embodiment 7 will next be described with reference to accompanying drawings.

Figure 39:
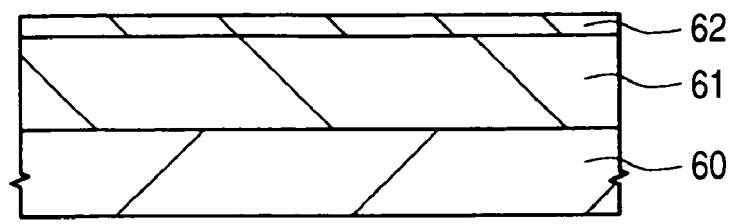
FIG. 39 is a cross-sectional view illustrating a manufacturing step of a semiconductor device according to Embodiment 7.

As illustrated in FIG. 39, a $p^-$ type silicon-germanium layer 61 is formed, for example, by CVD, over a $p^-$ type semiconductor substrate 60 composed of silicon having a p type impurity introduced therein. The $p^-$ type silicon-germanium layer 61 is obtained by causing a layer to grow by 1 μm while increasing stepwise a ratio of germanium from 0% to 15% and then causing it to grow further by about 1 μm while keeping the ratio of germanium at 15%.

Then, a $p^-$ type silicon layer is then formed over the $p^-$ type silicon-germanium layer 61. This $p^-$ type silicon layer has a thickness of about 85 nm. This $p^-$ type silicon layer will be a $p^-$ type strained silicon layer 62.

Figure 40:
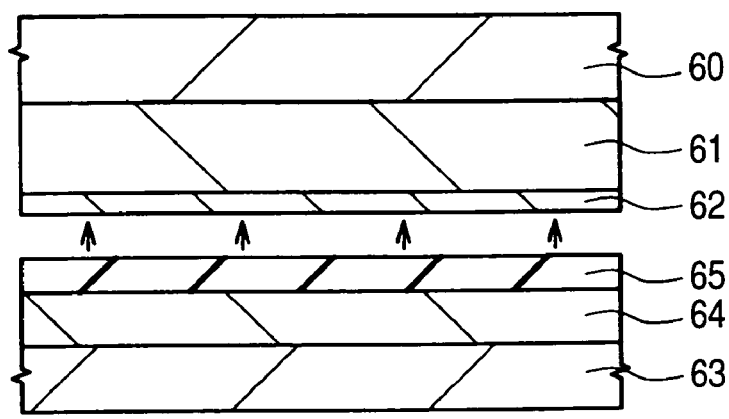
FIG. 40 is a cross-sectional view illustrating a manufacturing step of the semiconductor device following that of FIG. 39.

As illustrated in FIG. 40, a $p^+$ type semiconductor substrate 63 is prepared, in addition to the $p^-$ type semiconductor substrate 60. A $p^-$ type silicon layer 64 of about 2 μm thick is formed over this $p^+$ type semiconductor substrate 63, while a silicon oxide film 65 of about 100 nm thick is formed over this $p^-$ type silicon layer 64.

Figure 41:
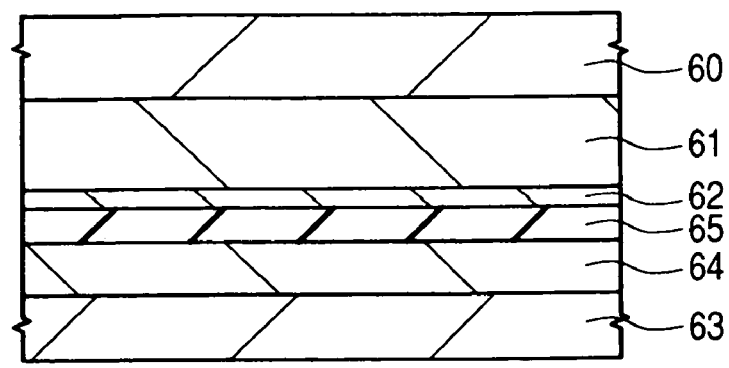
FIG. 41 is a cross-sectional view illustrating a manufacturing step of the semiconductor device following that of FIG. 40.
Figure 42:
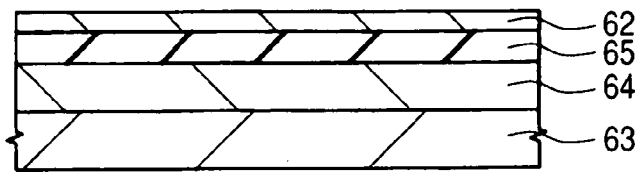
FIG. 42 is a cross-sectional view illustrating a manufacturing step of the semiconductor device following that of FIG. 41.

The $p^-$ type strained silicon layer 62 formed over the $p^-$ type semiconductor substrate 60 and the silicon oxide film 65 formed over the $p^+$ type semiconductor substrate 63 are faced each other and bonded by heating at 1000° C. as illustrated in FIG. 41.

Only the $p^-$ type strained silicon layer 62 is left over the silicon oxide film 65 of the $p^+$ type semiconductor substrate 63 by removing the $p^-$ type semiconductor substrate 60 and $p^-$ type silicon-germanium layer 61 by polishing and wet etching.

As subsequent steps, steps similar to those described in Embodiment 4 are employed (refer to FIGS. 29 to 33), whereby the LDMISFET Q7 of Embodiment 7 can be formed.

Embodiment 8

In Embodiment 8, a semiconductor device having an LDMISFET and CMISFET (Complementary MISFET) formed over one semiconductor substrate will be described. For example, in Embodiment 8, an LDMISFET used for power amplifier circuits 2A and 2B and a CMISFET used for a peripheral circuit as illustrated in FIG. 3 are formed as one chip over one semiconductor substrate.

Figure 43:
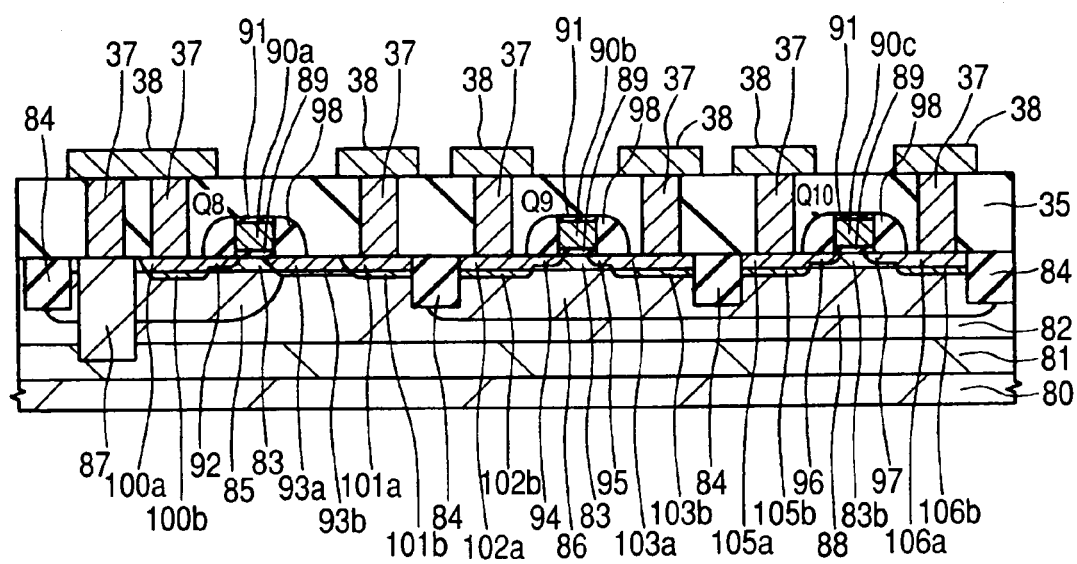
FIG. 43 is a cross-sectional view illustrating a semiconductor device according to Embodiment 8.

FIG. 43 is a cross-sectional view illustrating the LDMISFET Q8, n channel MISFET Q9 and p channel MISFET Q10 of Embodiment 8. In FIG. 43, a $p^+$ type silicon-germanium layer 81 having a p type impurity such as boron introduced therein at a high concentration is formed over a $p^+$ type semiconductor substrate 80 having a p type impurity such as boron introduced therein at a high concentration. A $p^-$ type silicon-germanium layer 82 having a p type impurity introduced therein at a low concentration is formed over the $p^+$ type silicon-germanium layer 81. A strained silicon layer is formed over the $p^-$ type silicon-germanium layer 82. This strained silicon layer is divided by element isolation regions 84 and an impurity introduced into the strained silicon layer is different among the regions thus divided. For example, in FIG. 43, three active regions are formed by the element isolation regions 84. In the active region on the left side of FIG. 43, that is, in an LDMISFET Q8 formation region, a p type strained silicon layer 83 is formed. Similarly, in the active region at the center of FIG. 43, that is, in an n channel MISFET Q9 formation region, the p type strained silicon layer 83 is formed. In an active region on the right side of FIG. 43, that is, in a p channel MISFET Q10 formation region, an n type strained silicon layer 83b is formed. These strained silicon layers (p type strained silicon layer 83 and n type strained silicon layer 83b) each has a thickness of about 70 nm which exceeds the critical film thickness at which no misfit dislocation occurs. On the interface between each of the strained layers and underlying silicon-germanium layer, there occur misfit dislocations.

In the $p^-$ type silicon-germanium layer 82 in the left-side active region, a p type silicon-germanium layer 85 is formed. This p type silicon-germanium layer 85 and the p type strained silicon layer 83 constitute a p well. Similarly, in the $p^-$ type silicon-germanium layer 82 in the central active region, a p type silicon-germanium layer 86 is formed and this p type silicon-germanium layer 86 and the p type strained silicon layer 83 constitute a p type sell. In the $p^-$ type silicon-germanium layer 82 in the right-hand active region, on the other hand, an n type silicon-germanium layer 88 is formed and this n type silicon-germanium layer 88 and the type strained silicon layer 83b constitute an n well.

On the left side active region, the LDMISFET Q8 of Embodiment 8 is formed. This LDMISFET Q8 has a similar constitution to the LDMISFET Q7 of Embodiment 6. Described specifically, the LDMISFET Q8 has a gate insulating film 89 formed over the p type strained silicon layer 83 and a gate electrode 90a formed over the gate insulating film 89. The gate insulating film 89 is made of, for example, a silicon oxide film. The gate electrode 90a is made of, for example, a polysilicon film. Over the gate electrode 90a, a silicon oxide film 91 is formed as a cap insulating film.

Sidewall spacers 98 are formed over the side walls of the gate electrode 90a. These sidewall spacers 98 are made of, for example, a silicon oxide film. An $n^+$ type strained silicon layer 92 is formed below one of the side walls 98, while an $n^-$ type strained silicon layer 93a and an $n^-$ type silicon-germanium layer 93b are formed below the other sidewall spacer 98. An n type impurity such as phosphorus (P) has been introduced into the $n^+$ type strained silicon layer 92 and by this $n^+$ type strained silicon layer 92, an extension region, which is a portion of the source region, is formed. By the $n^-$ type strained silicon layer 93a and $n^-$ type silicon-germanium layer 93b, a drain offset region is formed.

An $n^+$ type strained silicon layer 100a and an $n^+$ type silicon-germanium layer 100b are formed outside the extension region made of the $n^+$ type strained silicon layer 92. By the $n^+$ type strained silicon layer 100a and the $n^+$ type silicon-germanium layer 100b, an impurity diffusion region which will be a portion of a source region is formed. In other words, the source region is composed of the extension region and the impurity diffusion region. The extension region of the source region is shallower than the impurity diffusion region formed outside the extension region. The extension region of the source region is shallower than the interface between the strained silicon layer and silicon-germanium layer, while the impurity diffusion region of the source region is deeper than the interface between the strained silicon layer and silicon-germanium layer.

A drain region composed of an $n^+$ type strained silicon layer 101a and an $n^+$ type silicon-germanium layer 101b are formed outside the drain offset region composed of the $n^-$ type strained silicon layer 93a and $n^-$ type silicon-germanium layer 93b. The drain offset region and drain region each has a greater depth than the interface between the strained silicon layer and silicon-germanium layer.

In the central active region, the n channel MISFET Q9 of Embodiment 8 is formed. This n channel MISFET Q9 has essentially an almost similar constitution to that of the MISFET Q3 of Embodiment 3. Described specifically, the n channel MISFET Q9 has a gate insulating film 89 formed over the p type strained silicon layer 83 and a gate electrode 90b formed over the gate insulating film 89. The gate insulating film 89 is made of, for example, a silicon oxide film. The gate electrode 90b is made of, for example, a polysilicon film. Over the gate electrode 90b, a silicon oxide film 91 is formed as a cap insulating film.

Sidewall spacers 98 are formed over the side walls of the gate electrode 90b. The sidewall spacers 98 are made of, for example, a silicon oxide film. Below one of the side spacers 98, an n type strained silicon layer 94 is formed, while below the other side wall spacer 98, an n type strained silicon layer 95 is formed. An n type impurity such as phosphorus (P) has been introduced into the n type strained silicon layer 94. By this n type strained silicon layer 94, an extension region which is a portion of the source region is formed. An extension region which is a portion of the drain region is also formed by the n type strained silicon layer 95. These extension regions have each a smaller depth than the interface between the strained silicon layer and silicon-germanium layer.

An $n^+$ type strained silicon layer 102a and an $n^+$ type silicon-germanium layer 102b are formed outside the extension region made of the n type strained silicon layer 94. The $n^+$ type strained silicon layer 102a and $n^+$ type silicon-germanium layer 102b constitute an impurity diffusion region which will be a portion of a source region. In other words, the source region is composed of the extension region and the impurity diffusion region. The extension region of the source region has a smaller depth and at the same time, has a lower impurity concentration compared with the impurity diffusion region formed outside the extension region.

Similarly, outside the extension region made of the n type strained silicon layer 95, an $n^+$ type strained silicon layer 103a and an $n^+$ type silicon-germanium layer 103b are formed. By these $n^+$ type strained silicon layer 103a and $n^+$ type silicon-germanium layer 103b, an impurity diffusion region which will be a portion of a drain region is formed. In other words, the drain region is made of the extension region and impurity diffusion region. The extension region of the drain region also has a smaller depth and at the same time, a lower impurity concentration compared with the impurity diffusion region formed outside the extension region.

The impurity diffusion region of the source region and the impurity diffusion region of the drain region have a greater depth than the interface between the strained silicon layer and silicon-germanium layer.

In the right-hand active region, the p channel MISFET Q10 of Embodiment 8 is formed. This p channel MISFET Q10 has a gate insulating film 89 formed over the n type strained silicon layer 83b and a gate electrode 90c formed over the gate insulating film 89. The gate insulating film 89 is made of, for example, a silicon oxide film. The gate electrode 90c is made of, for example, a polysilicon film. Over the gate electrode 90c, a silicon oxide film 91 is formed as a cap insulating film.

Sidewall spacers 98 are formed over the side walls of the gate electrode 90c. These sidewall spacers 98 are made of, for example, a silicon oxide film. A p type strained silicon layer 96 is formed below one of the side wall spacers 98, while a p type strained silicon layer 97 is formed below the other sidewall spacer 98. A p type impurity such as boron (B) has been introduced into the p type strained silicon layer 96 and by this p type strained silicon layer 96, an extension region, which is a portion of a source region, is formed. By the p type strained silicon layer 97, an extension region which is a portion of a drain region is formed. These extension regions are shallower than the interface between the strained silicon layer and silicon-germanium layer.

A $p^+$ type strained silicon layer 105a and an $n^+$ type silicon-germanium layer 105b are formed outside the extension region made of the p type strained silicon layer 96. By the $n^+$ type strained silicon layer 105a and the $n^+$ type silicon-germanium layer 105b, an impurity diffusion region which will be a portion of the source region is formed. In other words, the source region is composed of the extension region and the impurity diffusion region. The extension region of the source region has a smaller depth and a lower impurity concentration compared with the impurity diffusion region formed outside the extension region.

Similarly, outside the extension region made of the p type strained silicon layer 97, a $p^+$ type strained silicon layer 106a and a $p^+$ type silicon-germanium layer 106b are formed. By these $p^+$ type strained silicon layer 106a and $p^+$ type silicon-germanium layer 106b, an impurity diffusion region which will be a portion of the drain region is formed. In other words, the drain region is made of the extension region and impurity diffusion region. The extension region of the drain region also has a smaller depth and at the same time, a lower impurity concentration compared with the impurity diffusion region formed outside the extension region.

The impurity diffusion region of the source region and the impurity diffusion region of the drain region are deeper than the interface between the strained silicon layer and silicon-germanium layer.

Over the LDMISFET Q8, n channel MISFET Q9 and p channel MISFET Q10 thus formed, an insulating film 35 which will be an interlayer insulating film is formed. This insulating film 35 has a contact hole 36 formed therein. A plug 37 is formed by filling a conductive material such as tungsten in the contact hole 36. The plug 37 is composed of a barrier film made of, for example, a titanium film or titanium nitride film, and a tungsten film. An interconnect 38 electrically connected to the plug 37 is formed over the plug 37. This interconnect 38 is made of, for example, an aluminum film. A trench extending from the p type strained silicon layer 83 to the p$^+$ type silicon-germanium layer 81 is formed on the side of the LDMISFET Q8 in order to electrically connect the source region of the LDMISFET Q8 to the p$^+$ type semiconductor substrate 80. A p$^+$ type polysilicon film 87 is filled in this trench.

A manufacturing method of the semiconductor device according to Embodiment 8 will next be described.

Figure 44:
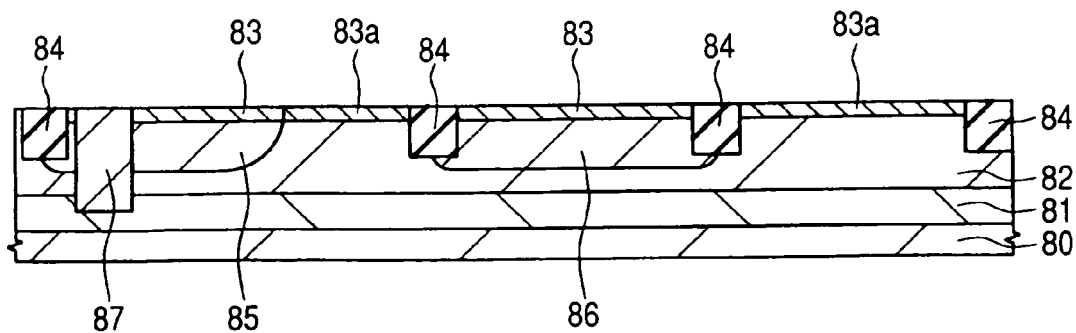
FIG. 44 is a cross-sectional view illustrating a manufacturing step of the semiconductor device according to Embodiment 8.

In a similar manner to that described in Embodiment 4 (refer to FIGS. 28 to 30), a structure as illustrated in FIG. 44 is formed. Described specifically, a p$^+$ type silicon-germanium layer 81, a p$^-$ type silicon-germanium layer 82, and a p$^-$ type strained silicon layer 83a are formed successively over a p$^+$ type semiconductor substrate 80. A p type impurity is introduced into the LDMISFET Q8 formation region, whereby a p type strained silicon layer 83 and a p type silicon-germanium layer 85 are formed. At the same time, a p type impurity is also introduced into the channel MISFET Q9 formation region to form a p type strained silicon layer 83 and a p type silicon-germanium layer 86. A p$^+$ type polysilicon film 87 and element isolation region 84 are formed as described in Embodiment 4.

Figure 45:
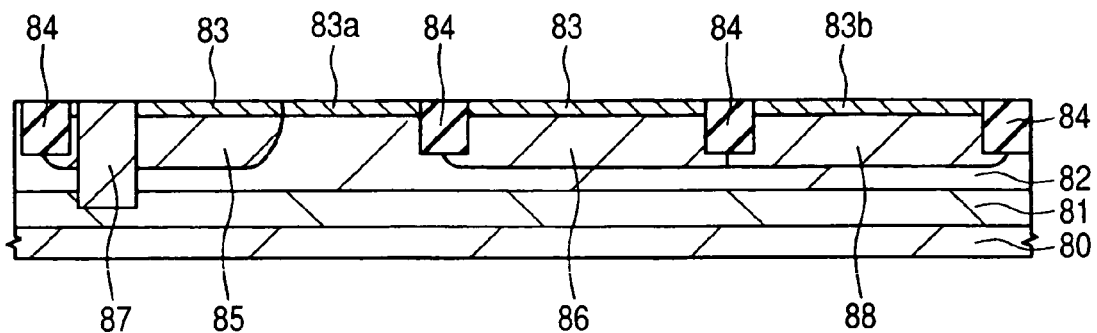
FIG. 45 is a cross-sectional view illustrating a manufacturing step of the semiconductor device following that of FIG. 44.
Figure 46:
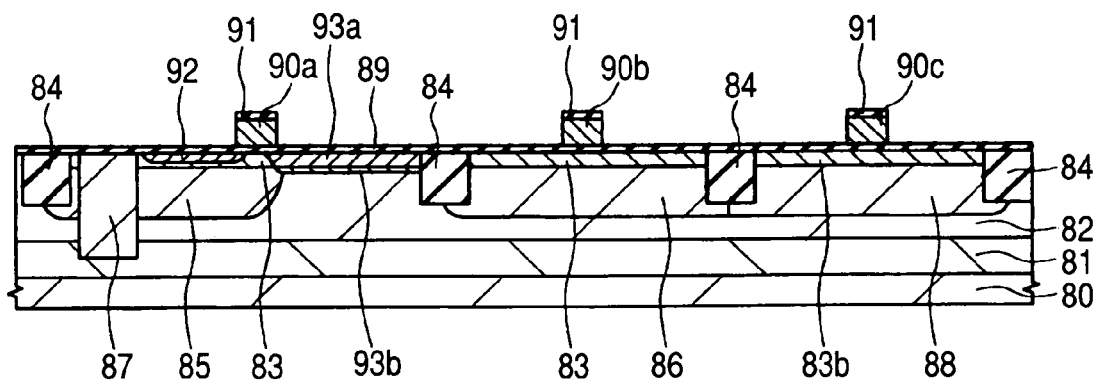
FIG. 46 is a cross-sectional view illustrating a manufacturing step of the semiconductor device following that of FIG. 45.

An n type impurity such as phosphorus (P) is introduced into the p channel MISFET Q10 formation region by making use of photolithography and ion implantation, followed by heat treatment, whereby an n type strained silicon layer 83b and n type silicon-germanium layer 88 are formed as illustrated in FIG. 45.

A gate insulating film 89 made of, for example, a silicon oxide film is then formed over the main surface of the p$^+$ type semiconductor substrate 20 by making use of thermal oxidation. A polysilicon film is then formed over the gate insulating film 89, followed by the formation of a silicon oxide film 91 over this polysilicon film. The polysilicon film and silicon oxide film 91 can be formed using, for example, CVD.

By making use of photolithography and etching, the polysilicon film and silicon oxide film 91 are patterned. By this patterning, gate electrodes 90a, 90b and 90c made of the polysilicon film can be formed.

After introduction of an n type impurity such as phosphorus by making use of photolithography and ion implantation, heat treatment is given to form an n$^+$ type strained silicon layer 92. Similarly, after introduction of an n type impurity by making use of photolithography and ion implantation, heat treatment is given to form an n$^-$ type strained silicon layer 93a and an n$^-$ type silicon-germanium layer 93b.

At this time, the thickness of the strained silicon layer decreases from about 85 nm to about 70 nm by etching upon washing in each step or consumption of it for the formation of the gate insulating film 89. Even if the thickness of the strained silicon layer is reduced to about 70 nm, it sufficiently exceeds the critical film thickness of about 25 nm (about 15 nm when etching by washing in each step or consumption of it for the formation of the gate insulating film 89 is taken into consideration). In short, the thickness of the strained silicon layer is greater than that of the conventional one.

Figure 47:
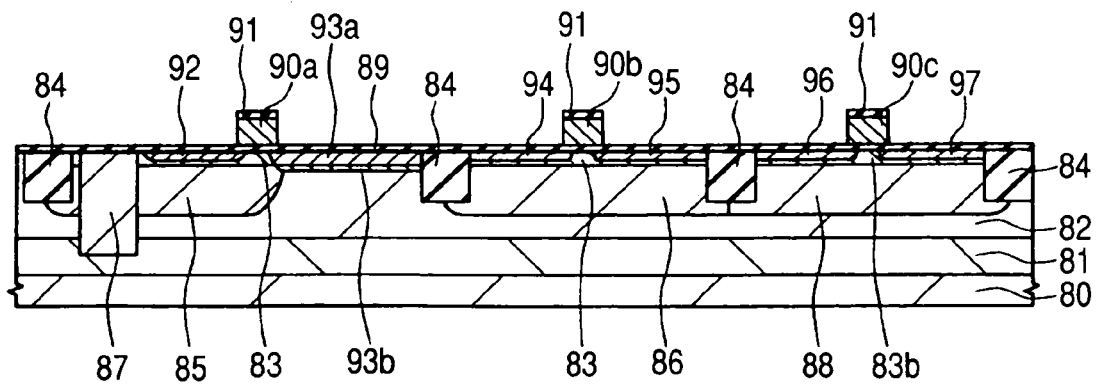
FIG. 47 is a cross-sectional view illustrating a manufacturing step of the semiconductor device following that of FIG. 46.

As illustrated in FIG. 47, an n type impurity such as phosphorus is introduced by making use of photolithography and ion implantation, followed by heat treatment, whereby n type strained silicon layers 94 and 95 are formed. Similarly, a p type impurity such as boron is introduced by making use of photolithography and ion implantation, followed by heat treatment, whereby p type strained silicon layers 96 and 97 are formed.

Figure 48:
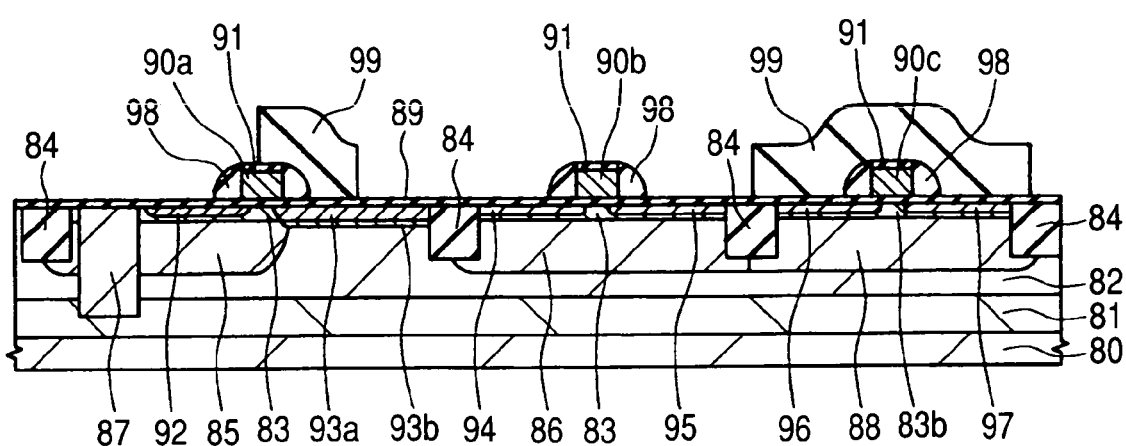
FIG. 48 is a cross-sectional view illustrating a manufacturing step of the semiconductor device following that of FIG. 47.

Then, for example, a silicon oxide film is formed over the main surface of the p$^+$ type semiconductor substrate 80. This silicon oxide film can be formed using, for example, CVD. As illustrated in FIG. 48, the silicon oxide film is anisotropically etched to form sidewall spacers 98 over the sidewalls of the gate electrodes 90a, 90b and 90c. After application of a resist film 99 over the main surface of the p$^+$ type semiconductor substrate 80, the resist film 99 is patterned by exposure and development. The resist film is patterned so as to leave its portions over the drain offset region of the LDMISFET Q8 and the p channel MISFET Q10 formation region.

Figure 49:
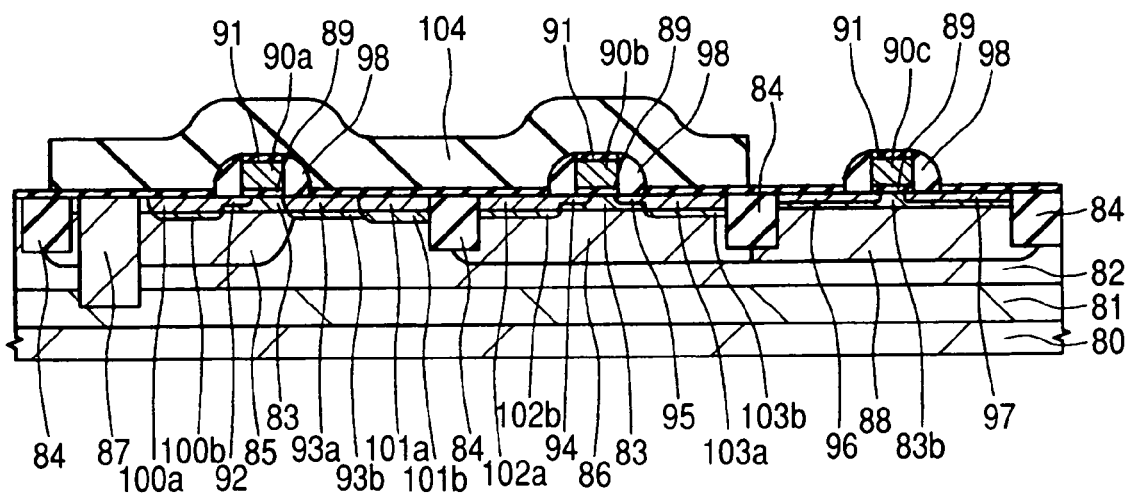
FIG. 49 is a cross-sectional view illustrating a manufacturing step of the semiconductor device following that of FIG. 48.

With the patterned resist film 99 as a mask, an n type impurity is introduced by using ion implantation, followed by heat treatment, whereby n$^+$ type strained silicon layers 100a, 101a, 102a and 103a and n$^+$ type silicon-germanium layers 100b, 101b, 102b and 103b are formed as illustrated in FIG. 49.

Figure 50:
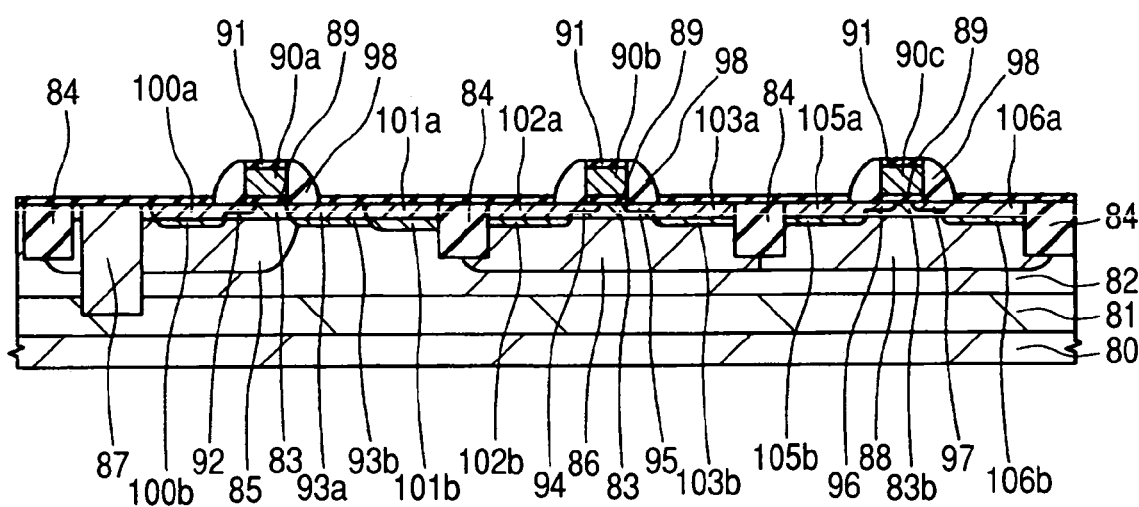
FIG. 50 is a cross-sectional view illustrating a manufacturing step of the semiconductor device following that of FIG. 49.

After application of a resist film 104 over the main surface of the p$^+$ type semiconductor substrate 80, the resist film 104 is patterned by exposure and development. The patterning is conducted so as not to leave the resist film 104 only in the p channel MISFET Q10 region. By ion implantation with the patterned resist film 104 as a mask, a p type impurity is introduced, followed by heat treatment, whereby p$^+$ type strained silicon layers 105a and 106a and p$^+$ type silicon-germanium layers 105b and 106b are formed as illustrated in FIG. 50.

An interconnect layer is then formed in a similar manner to that described in Embodiment 4, whereby a semiconductor device as illustrated in FIG. 43 can be formed.

According to Embodiment 8, the LDMISFET Q8 having a similar effect to the LDMISFET of Embodiment 6 and n channel MISFET Q9 and p channel MISFET Q10 having a similar effect to the MISFET of Embodiment 3 can be formed over one semiconductor substrate.

Embodiment 9

In Embodiments 1 to 8, sidewall spacers made of a silicon oxide film are formed over the sidewalls of the gate electrode. These sidewall spacers serve to determine the width of the extension region of the source region or drain region in self alignment. When an impurity diffusion region which is deeper and has a higher concentration than the extension region is formed outside the extension region, ion implantation is employed. By disposing sidewall spacers, penetration of ion into the extension region can be prevented. In other words, the sidewall spacers serve as a stopper for ion implantation and the width of the extension region below these sidewall spacers can be determined in self alignment.

Figure 51:
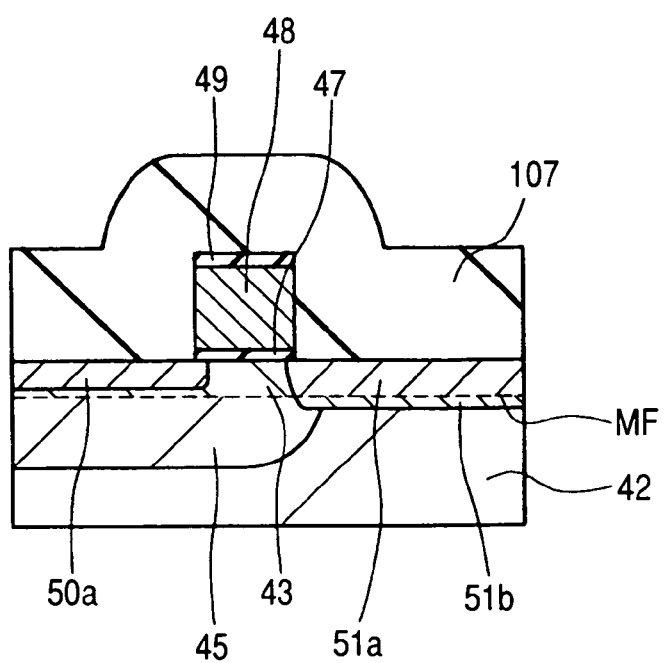
FIG. 51 is a cross-sectional view illustrating one step for forming sidewall spacers made of a silicon oxide film.
Figure 52:
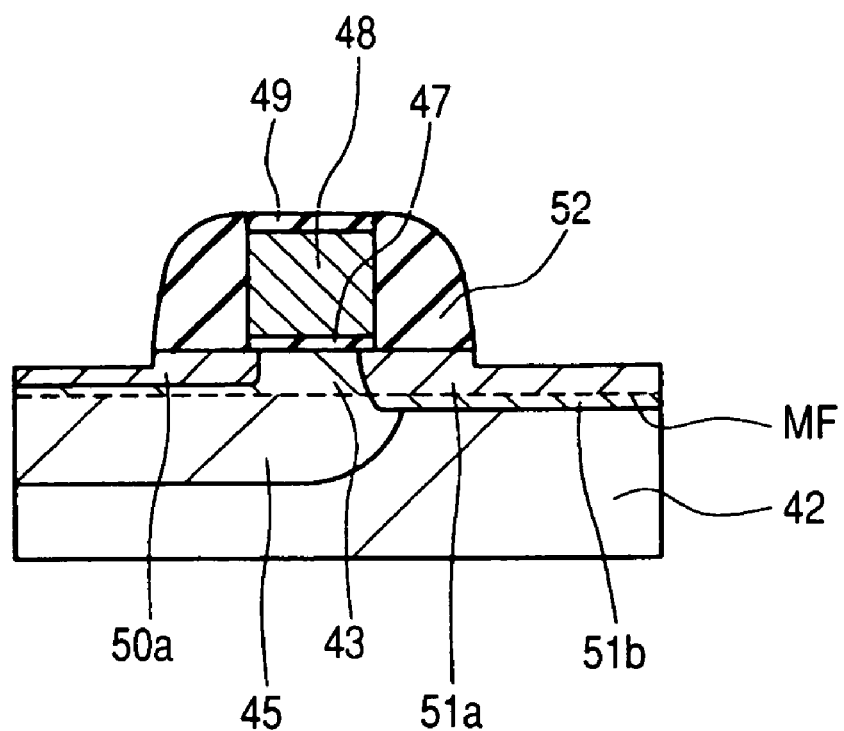
FIG. 52 is a cross-sectional view illustrating a step following that of FIG. 51.

There sometimes occur problems as described below when the sidewall spacers are formed. As illustrated in FIG. 51, when sidewall spacers are formed, a silicon oxide film 107 is formed over the entire surface of a substrate after formation of a gate electrode 48, an n+ type strained silicon layer 50a (extension region of the source region), an n− type strained silicon layer 51 and an n− type silicon-germanium layer 51a (drain offset region). As illustrated in FIG. 52, anisotropic etching is performed to remove the silicon oxide film 107 on a flat portion and to leave the silicon oxide film 107 only on the side walls of the gate electrode 48. The sidewall spacers 52 are formed in such a manner. In this case, the strained silicon layer sometimes becomes thin by etching as illustrated in FIG. 52 when etching selectivity to the silicon oxide film 107 relative to the underlying strained silicon layer is not sufficiently large. This inevitably increases the resistance of the source region, drain offset region and drain region.

Figure 53:
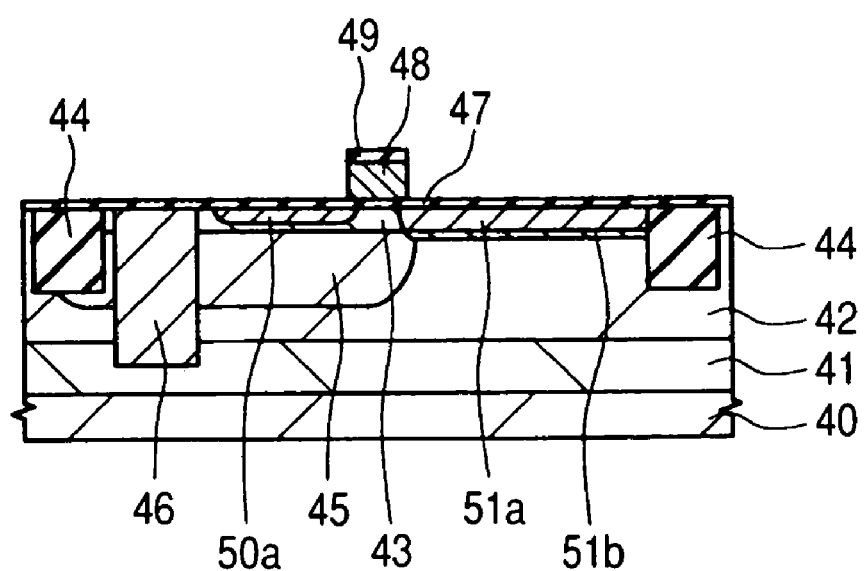
FIG. 53 is a cross-sectional view illustrating a manufacturing step of a semiconductor device according to Embodiment 9.

In Embodiment 9, an example in which sidewall spacers are formed not by a silicon oxide film but by a polysilicon film will be described. Here, the manufacturing method of the LDMISFET Q6 as described in Embodiment 6 is used as an example for the description. FIG. 53 illustrates the manufacturing step of the LDMISFET Q6 as described in Embodiment 6. In FIG. 53, steps until the formation of the gate electrode 48, n+ type strained silicon layer 50a (extension region of the source region), n− type strained silicon layer 51 and n− type silicon-germanium layer 51b (drain offset region) are similar to those of Embodiment 6.

Figure 54:
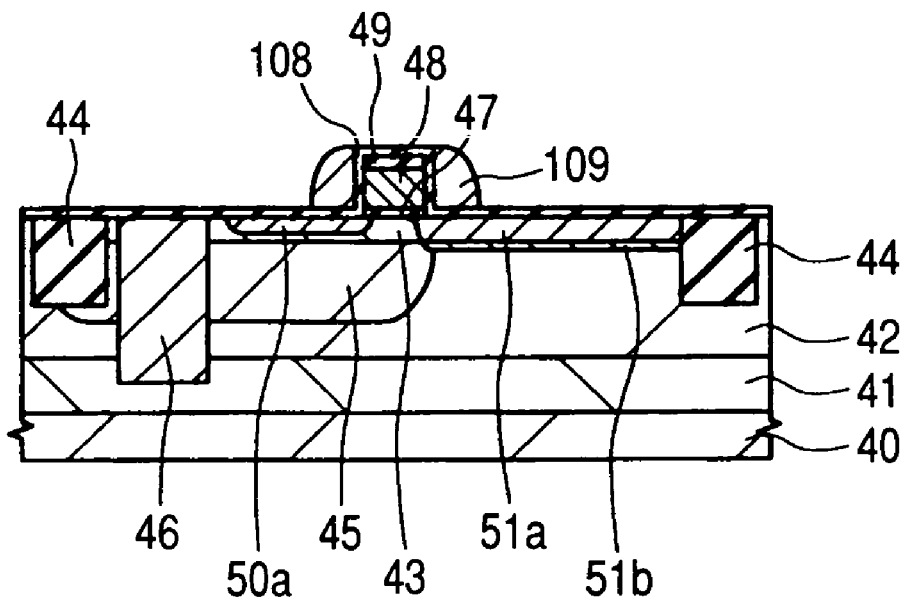
FIG. 54 is a cross-sectional view illustrating a manufacturing step of the semiconductor device following that of FIG. 53.

As illustrated in FIG. 54, a silicon oxide film 108 is then formed over the main surface of the p+ type semiconductor substrate 40. The side walls of the gate electrode 48 are covered with this silicon oxide film 108. The silicon oxide film 108 can be formed, for example, by CVD.

A polysilicon film is then formed over the silicon oxide film 108. The polysilicon film can be formed, for example, by CVD. Anisotropic dry etching is performed to remove the polysilicon film from a flat portion and leave it only on the side walls of the gate electrode 48. Sidewall spacers 109 can thus be formed from the polysilicon film. The strained silicon layer formed below the silicon oxide film 108 is not etched, because of a sufficient etching selectivity to the polysilicon film relative to the underlying silicon oxide film 108.

Figure 55:
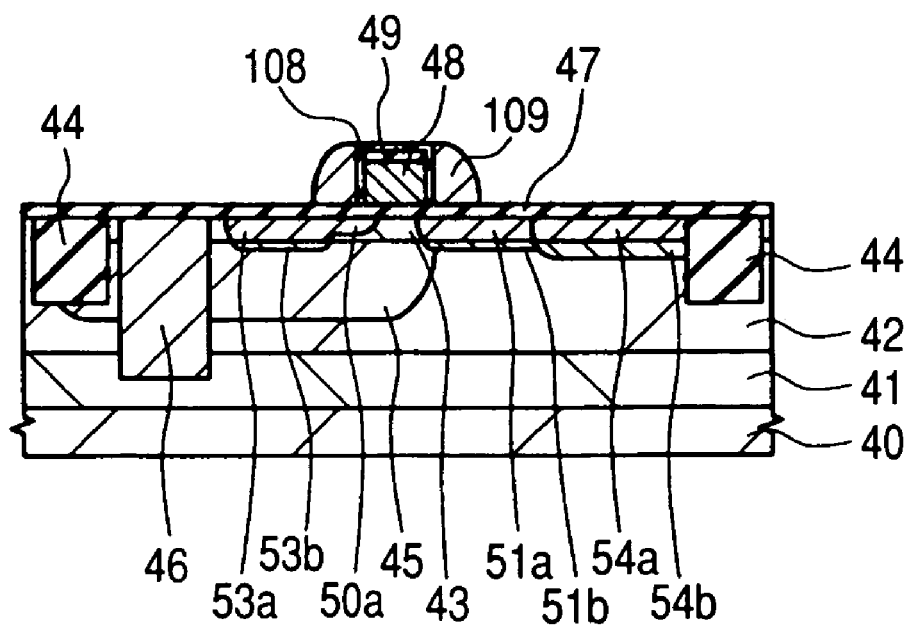
FIG. 55 is a cross-sectional view illustrating a manufacturing step of the semiconductor device following that of FIG. 54.

As illustrated in FIG. 55, an n type impurity is introduced using photolithography and ion implantation, followed by heat treatment, whereby n+ type strained silicon layers 53a and 54a and n+ type silicon-germanium layers 5b and 54b are formed.

Figure 56:
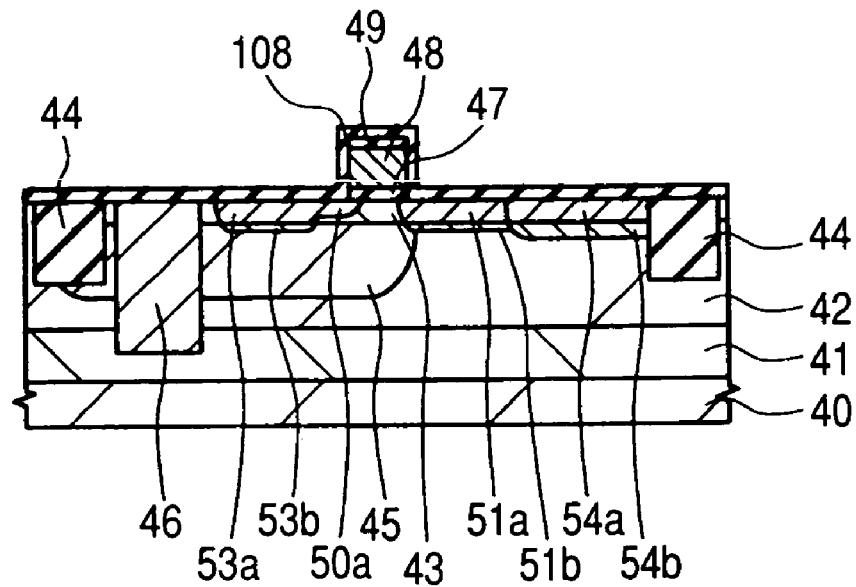
FIG. 56 is a cross-sectional view illustrating a manufacturing step of the semiconductor device following that of FIG. 55.
Figure 57:
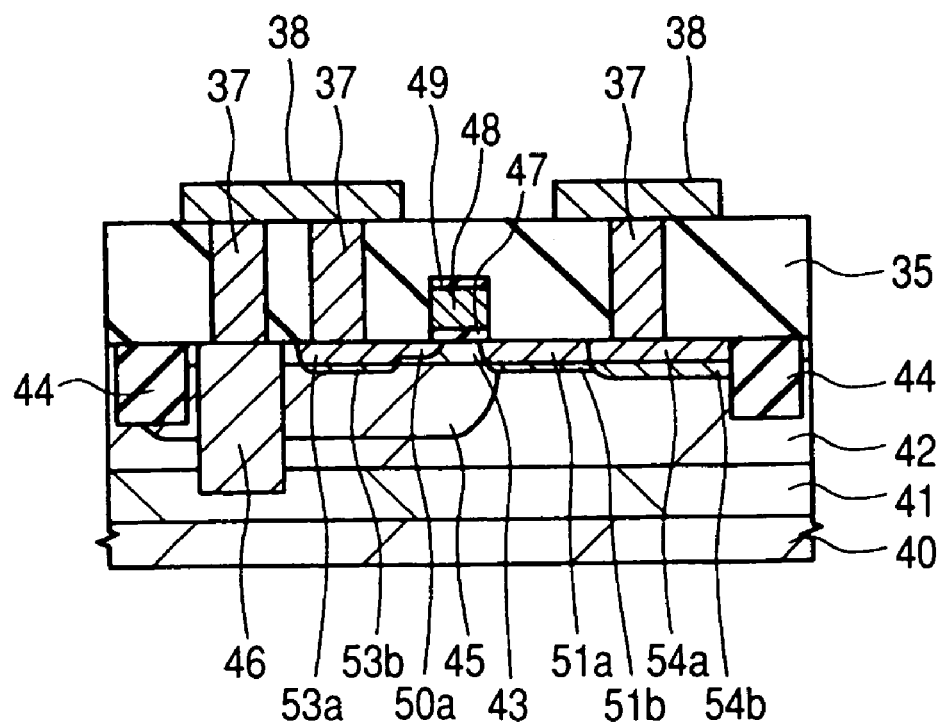
FIG. 57 is a cross-sectional view illustrating a manufacturing step of the semiconductor device following that of FIG. 56.

As illustrated in FIG. 56, the sidewall spacers 109 made of the polysilicon film are removed by etching. An interconnect layer is then formed in a similar manner to that described in Embodiment 4, whereby a semiconductor device as illustrated in FIG. 57 can be formed.

According to Embodiment 9, the silicon oxide film 108 is formed over the strained silicon layer when the sidewall spacers 109 are formed from the polysilicon film. During etching of the polysilicon film, an etching selectivity to it relative to the silicon oxide film 108 is sufficient so that the strained silicon layer formed below the silicon oxide film 108 is not etched. According to this Embodiment 9, since the strained silicon layer is not etched during the formation of the sidewall spacers 109, a resistance increase in the source region, drain offset region and drain regions can be prevented.

The inventions made by the present inventors were described specifically based on some embodiments. It is needless to say that the present invention is not limited to the above-described embodiments and modifications of the present invention may be implemented without departing from the spirit or scope of the invention.

Figure 58:
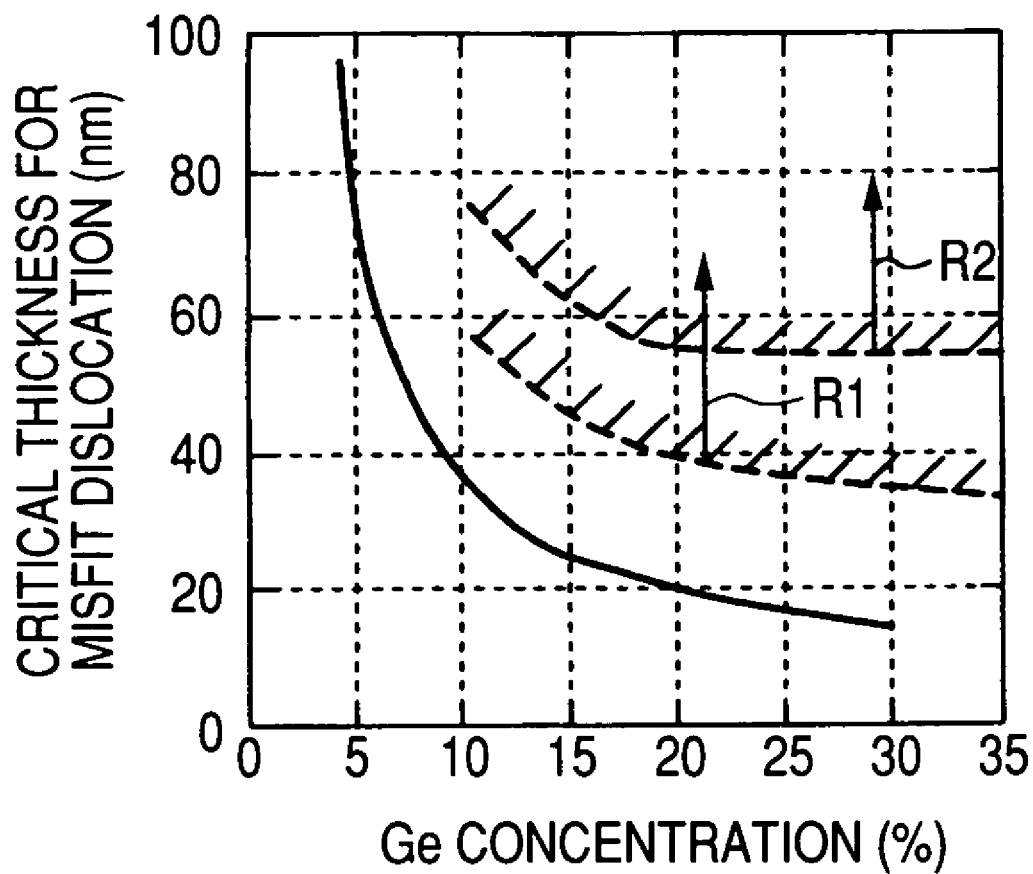
FIG. 58 is a graph showing a preferable thickness range of a strained silicon layer.

In Embodiments 1 to 9, the MISFET is able to have improved electrical properties by adjusting the thickness of the strained silicon layer to exceed the critical film thickness at which no misfit dislocation occurs. In particular, in the ordinary MISFET, it is desired to adjust the thickness of the strained silicon layer to fall within a thickness range of the region R1 as illustrated in FIG. 58. The lowest limit of the R1 region is almost the thickness of the extension region of the source region or the extension region of the drain region of the MISFET. In other words, a drastic improvement in the electrical properties can be expected by adjusting the thickness of the strained silicon layer to at least the thickness of the source region or drain region. In the case of the LDMISFET, it is desired to adjust the thickness of the strained silicon layer to a thickness falling within a thickness range of the region R2 as illustrated in FIG. 58. The lowest limit of the R2 region is almost the thickness of the drain offset region.

In the above described embodiments, the invention was applied, for example, to an LDMISFT used for a power amplifier circuit of an RF power module. The present invention can be applied not only to it but also to an MISFET used for an RF analogue circuit. Particularly when the MISFET used for an analogue circuit must satisfy both a high frequency operation and a certain level of breakdown voltage, the present invention is effective. In order to heighten the breakdown voltage, the thickness of a gate insulating film must be increased. For this increase in the thickness of a gate insulating film, a strained silicon layer must be thickened so as to exceed the critical film thickness at which no misfit dislocation occurs. By an increase in the thickness of the strained silicon layer, steps relating to the thickness of the strained silicon layer can be performed rather easily and an effect of improving a yield is also brought about. Application of the present invention to an MISFET used for an analogue circuit enables actualization of a high-speed and high-performance analogue circuit.

Even if misfit dislocations occur by an increase in the thickness of the strained silicon layer, application of the present invention enables to suppress the generation of a leak current to a similar level to a case where no misfit dislocation occurs. It is also advantageous to apply the present invention to an MISFET which does not need thickening of a strained silicon layer different from an LDMISFET or high breakdown voltage MISFET to be used for a power amplifier. By thickening the strained silicon layer, influence of uneven thickness of the strained silicon layer to cause variations in electrical properties can be reduced, which leads to an improvement in a production yield.

In the above-described embodiments, a description was made with a case where the main structure of the source region and drain region is an LDD (Lightly Doped Drain) structure. It is also possible to apply the present invention to a semiconductor device in which a source and drain region do not have an LDD structure.

The present invention is useful for various manufacturers of a semiconductor device.

The invention claimed is:

1. A semiconductor device having an MISFET, comprising:
    (a) a silicon-germanium layer formed over a semiconductor substrate;
    (b) a strained silicon layer formed over the silicon-germanium layer;
    (c) a gate insulating film formed over the strained silicon layer;

(d) a gate electrode formed over the gate insulating film; and (e) a source region and a drain region;

wherein the strained silicon layer is thicker than a critical film thickness at which misfit dislocations occur and the misfit dislocations exist on an interface between the strained silicon layer and silicon-germanium layer, wherein the source region and drain region are each comprised of an impurity diffusion region and an extension region which is shallower or has a lower impurity concentration than the impurity diffusion, and wherein the extension region is formed in a region shallower than the interface between the strained silicon layer and the silicon-germanium layer, and the extension region has a thickness greater than a critical film thickness at which misfit dislocations occur.

2. A semiconductor device according to claim 1, wherein the MISFET is an LDMISFET.

3. A semiconductor device according to claim 1, wherein the source region and drain region each has an impurity diffusion region and an extension region which is shallower or has a lower impurity concentration than the impurity diffusion region, and wherein on the interface between the silicon-germanium layer and the strained silicon layer, the extension region has an impurity concentration of $1\times10^{19}$ cm$^{-3}$ or less.

4. A semiconductor device according to claim 1, wherein the source region and drain region are each comprised of an impurity diffusion region and an extension region which is shallower or has a lower impurity concentration than the impurity diffusion region, and wherein the extension region is formed in a region shallower than the interface between the strained silicon layer and silicon-germanium layer.

5. A semiconductor device according to claim 4, wherein the impurity diffusion region of the source region or the impurity diffusion region of the drain region is formed in a region deeper than the interface between the strained silicon layer and the silicon-germanium layer.

6. A semiconductor device according to claim 1, wherein the source region and drain region are formed in the strained silicon layer.

7. A semiconductor device according to claim 2, wherein the source region has an impurity diffusion region and an extension region which is shallower or has a lower impurity concentration than the impurity diffusion region, and wherein on the interface between the strained silicon layer and silicon-germanium layer, the extension region has an impurity concentration of $1\times10^{19}$ cm$^{-3}$ or less.

8. A semiconductor device according to claim 7, wherein a drain offset region is formed between the drain region and the channel formation region, and wherein the drain offset region is formed in a region deeper than the interface between the strained silicon layer and the silicon-germanium layer.

9. A semiconductor device according to claim 2, wherein the source region is formed in the strained silicon layer.

10. A semiconductor device according to claim 9, wherein the thickness of the source region is thicker than the critical film thickness at which misfit dislocations occur.

11. A semiconductor device according to claim 2, wherein the source region has an impurity region and an extension region which is shallower or has a lower impurity concentration than the impurity diffusion region, and wherein the extension region is formed in a region shallower than the interface between the strained silicon layer and the silicon-germanium layer.

12. A semiconductor device according to claim 2, wherein the source region has an impurity region and an extension region which is shallower or has a lower impurity concentration than the impurity diffusion region, and wherein the extension region is formed in a region shallower than the interface between the strained silicon layer and the silicon-germanium layer and has a thickness greater than the critical film thickness at which misfit dislocations occurs.

13. A semiconductor device according to claim 11 or 12, wherein a drain offset region is formed between the drain region and the channel formation region, and wherein the impurity diffusion region of the source region, the drain region or the drain offset region is formed in a region deeper than the interface between the strained silicon layer and silicon germanium layer.

14. A semiconductor device according to claim 8, wherein ½ or greater of the thickness of the drain offset region exists in the strained silicon layer.

15. A semiconductor device according to claim 8, wherein at least ½ of the impurity contained in the drain-offset region exists in the strained silicon layer.

16. A semiconductor device according to claim 8, wherein the peak position of the impurity contained in the drain offset region exists in the strained silicon layer.

17. A semiconductor device according to claim 13, wherein ½ or greater of the thickness of the drain offset region exists in the strained silicon layer.

18. A semiconductor device according to claim 13, wherein at least ½ of the impurity contained in the drain-offset region exists in the strained silicon layer.

19. A semiconductor device according to claim 13, wherein the peak position of the impurity contained in the drain offset region exists in the strained silicon layer.

* * * * *